(12) United States Patent
Yano et al.

(10) Patent No.: US 8,291,287 B2
(45) Date of Patent: Oct. 16, 2012

(54) ENCODING AND MODULATING METHOD, AND DECODING METHOD FOR WIRELESS COMMUNICATION APPARATUS

(75) Inventors: Takashi Yano, Tokorozawa (JP); Tadashi Matsumoto, Nomi (JP)

(73) Assignee: Hitachi, Ltd., Tokyo (JP)

(*) Notice: Subject to any disclaimer, the term of this patent is extended or adjusted under 35 U.S.C. 154(b) by 30 days.

(21) Appl. No.: 12/625,605

(22) Filed: Nov. 25, 2009

(65) Prior Publication Data
US 2010/0146365 A1   Jun. 10, 2010

(30) Foreign Application Priority Data
Nov. 28, 2008   (JP) .................................. 2008-303429

(51) Int. Cl.
*H03M 13/00* (2006.01)
(52) U.S. Cl. .................................................. 714/752
(58) Field of Classification Search .................... None
See application file for complete search history.

(56) References Cited

U.S. PATENT DOCUMENTS

| | | | |
|---|---|---|---|
| 2003/0039318 A1* | 2/2003 | Tong et al. | 375/298 |
| 2003/0088822 A1* | 5/2003 | Kim et al. | 714/790 |
| 2003/0112745 A1* | 6/2003 | Zhuang et al. | 370/208 |
| 2004/0208623 A1* | 10/2004 | Kumar | 398/161 |
| 2005/0022090 A1* | 1/2005 | Cameron et al. | 714/755 |
| 2005/0111565 A1* | 5/2005 | Pons et al. | 375/265 |
| 2006/0078062 A1* | 4/2006 | Pons et al. | 375/265 |
| 2006/0104378 A1* | 5/2006 | Allpress et al. | 375/261 |
| 2006/0209674 A1* | 9/2006 | Chen et al. | 370/209 |
| 2006/0251150 A1* | 11/2006 | Furman et al. | 375/146 |
| 2007/0016841 A1* | 1/2007 | Cameron et al. | 714/780 |
| 2007/0147481 A1* | 6/2007 | Bottomley et al. | 375/148 |
| 2009/0245432 A1 | 10/2009 | Matsumoto et al. | |
| 2009/0282314 A1* | 11/2009 | Djordjevic et al. | 714/755 |
| 2009/0297144 A1* | 12/2009 | Djordevic et al. | 398/39 |
| 2010/0100793 A1* | 4/2010 | Limberg | 714/756 |

FOREIGN PATENT DOCUMENTS

JP   2009-239377   10/2009

OTHER PUBLICATIONS

Ben Lu, Xiaodong Wang, and Krishna R. Narayanan, LDPC-Based Space—Time Coded OFDM Systems Over Correlated Fading Channels: Performance Analysis and Receiver Design, 2002, vol. 50, pp. 1-15.*

(Continued)

*Primary Examiner* — Guerrier Merant
(74) *Attorney, Agent, or Firm* — Antonelli, Terry, Stout & Kraus, LLP.

(57) ABSTRACT

Provided is a bit interleaved coded modulation-iterative decoding (BICM-ID) technique suffering a small loss in a transfer rate. A BICM-ID technique allowing a decoder to treat a small processing quantity is also provided. Encoding is carried out according to a code based on an iterative code. Encoded bits are reordered during interleaving processing, subjected to multi-valued modulation through extended mapping, and then transmitted. The extended mapping includes number-of-bits thinning processing of thinning l bits into m bits (m<l), and non-gray mapping. During the number-of-bits thinning processing, at least one of a predetermined number of bits is determined with only one of interleaved bits.

9 Claims, 23 Drawing Sheets

Iterative Decoding

OTHER PUBLICATIONS

X Li and J.A. Ritcey, "Bit-interleaved coded modulation with iterative decoding", IEEE Communications Letters, vol. 1, pp. 169-171, 1997.

F. Schreckenach, et al., "Optimized Symbol Mappings for Bit-Interleaved Coded Modulation with Iterative Decoding", IEEE Globecom 2003, pp. 3316-3320, 2003.

P. Henkel, "Extended Mappings for Bit-Interleaved Coded Modulations", IEEE PIMRC 2006.

S. ten Brink, "Convergence Behavior of Iteratively Decoded Parallel Concatenated codes", IEEE Transactions on Communications, vol. 49, No. 10, pp. 1727-1737, Oct. 2001.

S. ten Brink, et al., "Design of Low-Density Parity-Check Codes for Modulation and Detection", IEEE Transactions on Communications, vol. 52, No. 4, Apr. 2004.

* cited by examiner

16QAM MSEW

64QAM Non-Gray Mapping

| m5-m0 | I | Q | m5-m0 | I | Q |
|---|---|---|---|---|---|
| 000000 | 0.5 | -0.5 | 011111 | 1.5 | -3.5 |
| 000001 | 3.5 | 3.5 | 100000 | -2.5 | 1.5 |
| 000010 | -1.5 | -3.5 | 100001 | 2.5 | -2.5 |
| 000011 | -0.5 | 1.5 | 100010 | 3.5 | 0.5 |
| 000100 | -2.5 | 2.5 | 100011 | -2.5 | -2.5 |
| 000101 | 1.5 | -1.5 | 100100 | 1.5 | -2.5 |
| 000110 | 1.5 | 0.5 | 100101 | -1.5 | 1.5 |
| 000111 | -2.5 | -3.5 | 100110 | -2.5 | 0.5 |
| 001000 | -3.5 | -3.5 | 100111 | 3.5 | -0.5 |
| 001001 | -0.5 | 0.5 | 101000 | 1.5 | -0.5 |
| 001010 | 1.5 | 2.5 | 101001 | -3.5 | -2.5 |
| 001011 | -0.5 | -3.5 | 101010 | -3.5 | -0.5 |
| 001100 | 0.5 | -1.5 | 101011 | 2.5 | 2.5 |
| 001101 | -2.5 | 3.5 | 101100 | -0.5 | 3.5 |
| 001110 | -3.5 | -1.5 | 101101 | 2.5 | -1.5 |
| 001111 | 1.5 | 1.5 | 101110 | 2.5 | -0.5 |
| 010000 | 3.5 | -3.5 | 101111 | -2.5 | -0.5 |
| 010001 | -1.5 | -0.5 | 110000 | 2.5 | 0.5 |
| 010010 | 0.5 | 2.5 | 110001 | -3.5 | 2.5 |
| 010011 | 3.5 | -1.5 | 110010 | -2.5 | -1.5 |
| 010100 | -1.5 | -2.5 | 110011 | 1.5 | 3.5 |
| 010101 | 0.5 | 3.5 | 110100 | -1.5 | 2.5 |
| 010110 | 2.5 | -3.5 | 110101 | 0.5 | -2.5 |
| 010111 | -0.5 | -0.5 | 110110 | 3.5 | 2.5 |
| 011000 | -1.5 | 0.5 | 110111 | -3.5 | 1.5 |
| 011001 | 3.5 | -2.5 | 111000 | -3.5 | 3.5 |
| 011010 | 0.5 | -3.5 | 111001 | 0.5 | 0.5 |
| 011011 | -0.5 | 2.5 | 111010 | 2.5 | 1.5 |
| 011100 | 2.5 | 3.5 | 111011 | -0.5 | -2.5 |
| 011101 | -1.5 | -1.5 | 111100 | -0.5 | -1.5 |
| 011110 | 0.5 | 1.5 | 111101 | -1.5 | 3.5 |

16ASK Non-Gray Mapping

| Code Type | Code design | | | 
|---|---|---|---|
| | Variable node degrees | Check node degree | Coding rate |
| I | $d_{v1}=11$ (93%), $d_{v2}=100$ (7%) | $d_c=8$ | 0.0508 |
| II | $d_{v1}=5$ (93%), $d_{v2}=50$ (7%), $d_{v3}=50$ (0.1%) | $d_c=32$ | 0.1183 |
| III | $d_{v1}=3$ (87%), $d_{v2}=15$ (13%), $d_{v3}=80$ (0.6%) | $d_c=512$ | 0.1992 |
| IV | $d_{v1}=2$ (44%), $d_{v2}=3$ (35%), $d_{v3}=5$ (14%), $d_{v4}=12$ (7%) | $d_c=512$ | 0.2876 |
| V | $d_{v1}=2$ (55%), $d_{v2}=3$ (33%), $d_{v3}=5$ (12%) | $d_c=1024$ | 0.3714 |

8PSK Gray

16QAM Gray

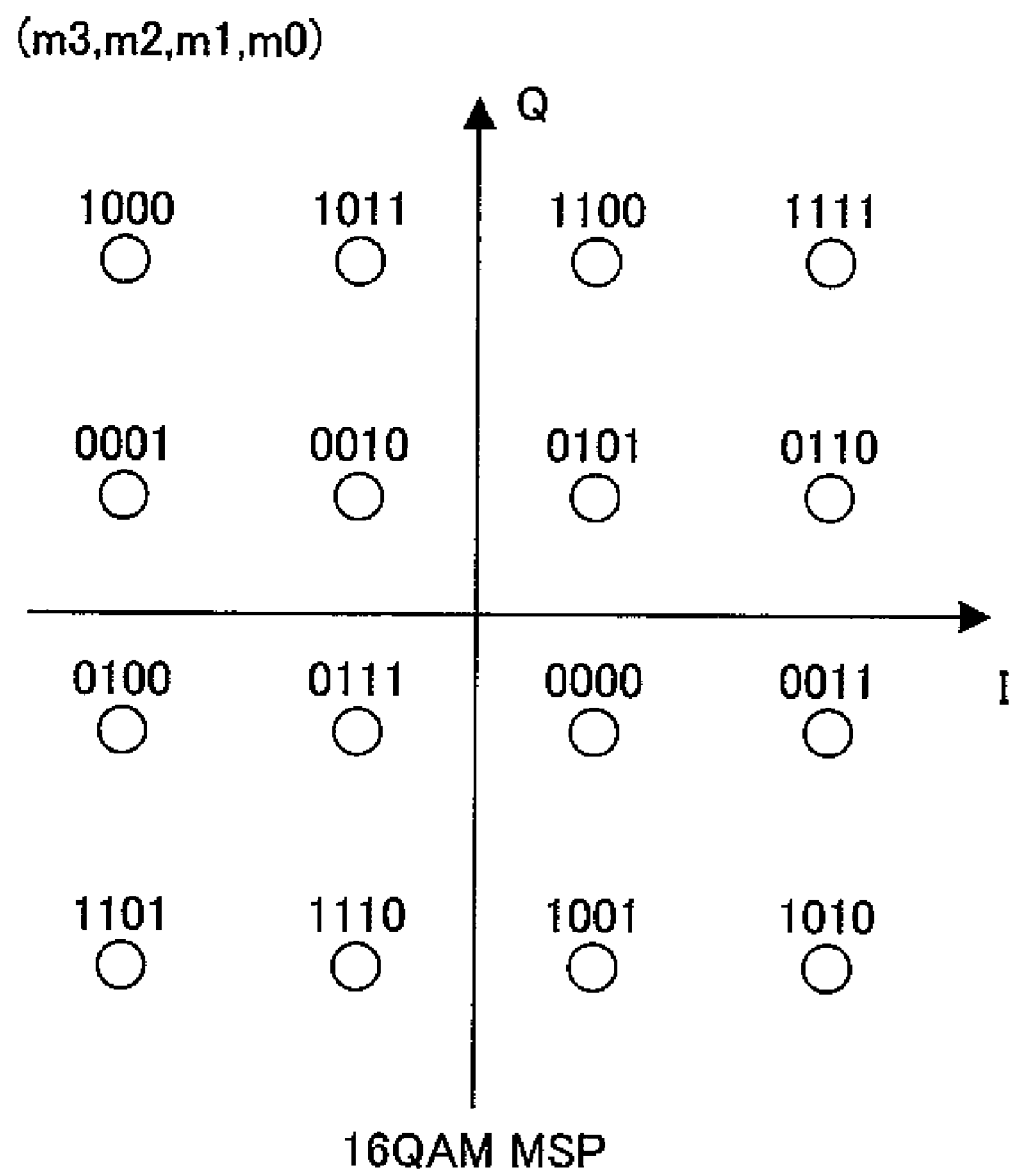

16QAM Extended Mapping (l=6)

ENCODING AND MODULATING METHOD, AND DECODING METHOD FOR WIRELESS COMMUNICATION APPARATUS

CLAIM OF PRIORITY

The present application claims priority from Japanese Patent Application JP2008-303429 filed on Nov. 28, 2008, the content of which is hereby incorporated by reference into this application.

BACKGROUND OF THE INVENTION

1. Field of the Invention

The present invention relates to an encoding and modulating method for wireless communication apparatus that transmits or receives data through a wireless propagation channel, and a decoding method for the wireless communication apparatus.

2. Description of the Related Art

For years, a commitment to a subject of how to realize efficient communications while attaining the Shannon limit, which is the theoretical limit of information through a channel, by appropriately combining an encoding technique and a modulation technique as a wireless communication technique for mobile communications or the like has been made in earnest. Therefore, a specialized encoding (error-correction encoding) technique has been adopted. According to the IS-95 based on the code division multiple access (CDMA) technique that was introduced in the mid 1990s, a convolutional code that specifies a constraint length of 9 (k=9) and a Viterbi decoding system are used in combination to achieve communications under a low signal-to-noise ratio. Eventually, as already known, a system capacity has been markedly increased. In the third-generation mobile telecommunications system IMT-200 and its innovated systems of the high-speed packet access (HSPA) system and the evolution data-only (EvDO) system, turbo coding and iterative decoding are adopted as the error-correction encoding technique. Further, for new-generation systems, adoption of the low density parity check (LDPC) code has been discussed. In the innovated systems of IMT-2000, a multi-valued modulation technique has been adopted in order to achieve high-speed data communications. 8 phase shift keying (PSK), 16 quadrature amplitude modulation (QAM), and 64 QAM are stipulated as multi-valued modulating techniques, and the numbers of bits that can be transmitted in the form of a symbol according to the respective techniques are 3, 4, and 6 respectively. For demodulating multiple bits, gray mapping is adopted as a bit allocation (mapping) method in order to draw out a larger amount of information. The gray mapping is widely adopted because of the feature that since bits are allocated (mapped) so that adjoining signal points (symbols) will be different from each other in only one bit, an amount of information a sole demodulator (demapper) can draw out is maximized.

The foregoing approach can be said to pursue specialized modulating processing, which is paired with modulation, independently of specialized decoding processing that is paired with encoding. In contrast, a technology called bit interleaved coded modulation with iterative decoding (BICM-ID) ("Bit-interleaved coded modulation with iterative decoding" by X. Li and J. A. Ritcey (IEEE Communications Letters, vol. 1, pp. 169-171, 1997) has been introduced and has attracted attention. The BICM-ID technology is such that demodulating processing paired with modulation and decoding processing paired with encoding are iteratively executed, and the results of one of the pieces of processing are referenced during the other processing to be performed next time, or in other words, a so-called turbo signal processing technique is implemented together with the demodulating processing and decoding processing. According to the BICM-ID technology, as described in "Optimized Symbol Mappings for Bit-Interleaved Coded Modulation with Iterative Decoding" by F. Schereckenbach, N. Gortz, J. Hagenauer, and G. Bauch (IEEE GLOBECOM 2003, pp. 3316-3320, 2003), the specialties in an encoding technique and a modulating technique are not improved separately but are matched each other in order to realize excellent specialty.

According to "Optimized Symbol Mappings for Bit-Interleaved Coded Modulation with Iterative Decoding" by F. Schereckenbach, N. Gortz, J. Hagenauer, and G. Bauch (IEEE GLOBECOM 2003, pp. 3316-3320, 2003), when a BICM-ID technique is constructed by adopting as an encoding technique the convolutional code which specifies a constraint length of 3 (K=3) and an encoding ratio of 1/2 (R=1/2), and adopting a mapping technique called modified set partitioning (MSP) (FIG. 30) that is a modulation technique inferior to the gray mapping in terms of specialty, the BICM-ID technique exerts more excellent specialty than a BICM-ID technique adopting the gray mapping. According to "Extended Mappings for Bit-Interleaved Coded Modulation" by P. Henkel (IEEE PIMRC, 2006), a BICM-ID technique is constructed by adopting as an encoding technique a convolutional code which specifies a constraint length of 2 (K=2) and an encoding ratio of 1/2 (R=1/2), and adopting as a modulation technique special mapping which is called extended mapping and in which a larger number of bits than the number of bits capable of being originally mapped is allocated as shown in FIG. 32, the BICM-ID technique exhibits excellent specialty. In "Optimized Symbol Mappings for Bit-Interleaved Coded Modulation with Iterative Decoding" by F. Schereckenbach, N. Gortz, J. Hagenauer, and G. Bauch (IEEE GLOBECOM 2003, pp. 3316-3320, 2003) and "Extended Mappings for Bit-Interleaved Coded Modulation" by P. Henkel (IEEE PIMRC, 2006), the BICM-ID techniques are described to exhibit excellent specialty by employing extrinsic information transfer (EXIT) analysis introduced in "Convergence Behavior of Iteratively Decoded Parallel Concatenated Codes" by S. ten Brink, (IEEE Transactions on Communications, Vol. 49, No. 10, pp. 1727-1737, October 2001).

In contrast, a BICM-ID technique employing a code, which exhibits excellent specialty by itself, such as the aforesaid LDPC code is described in "Design of Low-Density Parity-Check Codes for Modulation and Detection" by S. ten Brink, G. Kramer, and A. Ashikhmin (IEEE Transactions on Communications, Vol. 52, No. 4, April 2004).

BRIEF SUMMARY OF THE INVENTION

The convolutional encoding described in "Optimized Symbol Mappings for Bit-Interleaved Coded Modulation with Iterative Decoding" by F. Schereckenbach, N. Gortz, J. Hagenauer, and G. Bauch (IEEE GLOBECOM 2003, pp. 3316-3320, 2003). and "Extended Mappings for Bit-Interleaved Coded Modulation" by P. Henkel (IEEE PIMRC, 2006) specifies the small constraint length of 3 or 2, and the specialty thereof is inferior to that of the convolutional code adopted in the IS-95. The specialty of the modulation technique MSP described in "Optimized Symbol Mappings for Bit-Interleaved Coded Modulation with Iterative Decoding" by F. Schereckenbach, N. Gortz, J. Hagenauer, and G. Bauch (IEEE GLOBECOM 2003, pp. 3316-3320, 2003) is inferior to that of the gray mapping. Further, the extended mapping adopted in "Extended Mappings for Bit-Interleaved Coded Modulation" by P. Henkel (IEEE PIMRC, 2006) is a modulation technique that cannot demodulate each bit without an error when being implemented in a demodulator (demapper) even in a case where no noise is observed. Nevertheless, the techniques exhibit excellent specialties. This is because, as seen from the extrinsic information transfer (EXIT) charts presented by the respective documents, an EXIT curve concerning the demodulator (demapper) and an EXIT curve concerning a decoder are well-matched each other, and mutual information at an intersection between the EXIT curve concerning the demodulator and the EXIT curve concerning the decoder, that is, a point of convergence of pieces of iterative processing employed in the BICM-ID technique is nearly 1.

The EXIT chart (FIG. 31) shown in "Optimized Symbol Mappings for Bit-Interleaved Coded Modulation with Iterative Decoding" by F. Schereckenbach, N. Gortz, J. Hagenauer, and G. Bauch (IEEE GLOBECOM 2003, pp. 3316-3320, 2003) will be described below. A description will be made of a case where 16 QAM multi-valued modulation is adopted, that is, convolutional encoding for which a constraint length of 3 and an encoding ratio 1/2 (R=1/2) are specified is adopted as an encoding technique and MSP mapping is adopted as a modulation technique. An EXIT curve 2300 is concerned with a decoder, and an EXIT curve 2302 is concerned with a demodulator. The axis of abscissas indicates mutual information to be inputted to the demodulator, and the axis of ordinates indicates mutual information to be outputted from the demodulator. According to the BICM-ID technique, demodulation and decoding are iterated. Therefore, the value on the axis of abscissas corresponds to mutual information outputted from the decoder, and the value on the axis of ordinates corresponds to mutual information inputted to the decoder. A broken line 2304 indicates that the pieces of mutual information approach to 1 along with the iteration of demodulation and decoding. Namely, the demodulator outputs the first information on mutual information of approximately 0.37 to the decoder, and the decoder decodes the information, and outputs information on mutual information of approximately 0.41 to the demodulator. Owing to the iteration, the mutual information (the axis of abscissas) outputted from the decoder is seen to converge at 1. For reference, an EXIT curve 2306 is an EXIT curve to be concerned with the demodulator in a case where the gray mapping is adopted as the modulation technique. In this case, the mutual information outputted from the demodulator is nearly constant. This means that the BICM-ID technique is ineffective.

The same applies to the EXIT chart (FIG. 33) shown in "Extended Mappings for Bit-Interleaved Coded Modulation" by P. Henkel (IEEE PIMRC, 2006). A description will be made of a case where 16 QAM multi-valued modulation is adopted, that is, the convolutional encoding for which a constraint length of 2 and an encoding ration of 1/2 (R=1/2) are specified is adopted as an encoding technique and the extended mapping shown in FIG. 32 is adopted as a modulation technique. An EXIT curve 2500 is an EXIT curve concerning a decoder, and an EXIT curve 2502 is an EXIT curve concerning a demodulator. The axis of abscissas indicates mutual information to be inputted to the demodulator, and the axis of ordinates indicates mutual information value to be outputted from the demodulator. Similarly to FIG. 31, a broken line 2504 indicates that the pieces of mutual information approach to 1 along with iteration of demodulation and decoding.

The EXIT charts shown in FIG. 31 and FIG. 33 demonstrate that the EXIT curve concerning the demodulator and the EXIT curve concerning the decoder are separated from each other except at an intersection. An area defined between the EXIT curve concerning the demodulator and the EXIT curve concerning the decoder is known to indicate a loss in a transfer rate. When the area approaches to 0, it means that the transfer rate approaches to the Shannon limit while being restricted by a constellation of a modulated signal. This is interpreted as described below. Namely, when the EXIT curve concerning the demodulator and the EXIT curve concerning the decoder are separated from each other, it means that: information inputted from the demodulator (decoder) to the decoder (demodulator) contains a large amount of redundant information; and the pieces of mutual information are largely improved. In other words, the transfer rate decreases. From this viewpoint, a BICM-ID technique suffering a small loss in the transfer rate is preferred to the BICM-ID techniques described in "Optimized Symbol Mappings for Bit-Interleaved Coded Modulation with Iterative Decoding" by F. Schereckenbach, N. Gortz, J. Hagenauer, and G. Bauch (IEEE GLOBECOM 2003, pp. 3316-3320, 2003) and "Extended Mappings for Bit-Interleaved Coded Modulation" by P. Henkel (IEEE PIMRC, 2006). Therefore, the first object of the present invention is to provide the BICM-ID technique suffering a small loss in the transfer rate.

The BICM-ID technique described in "Design of Low-Density Parity-Check Codes for Modulation and Detection" by S. ten Brink, G. Kramer, and A. Ashikhmin (IEEE Transactions on Communications, Vol. 52, No. 4, April 2004) succeeds the specialty of the LDPC code. The EXIT chart is used to signify that the BICM-ID technique suffers a very small loss in a transfer rate. However, since the BICM-ID technique employs the LDPC code that is a powerful code, it has such a drawback that a processing quantity to be treated by a decoder increases. Accordingly, the second object of the present invention is to provide a BICM-ID technique allowing the decoder to treat a small processing quantity.

In order to accomplish the foregoing objects, transmitting-side wireless communication apparatus performs encoding according to a code based on an iterative code regarded as the simplest code, performs interleaving processing of reordering encoded bits, performs multi-valued modulation through non-gray mapping, for example, extended mapping, and transmits the resultant data. Receiving-side wireless communication apparatus performs demodulating processing (demapping processing) paired with the mapping, de-interleaves the results of demodulation, and interleaves the results of decoding processing performed according to the code based on the iterative code. The demodulating processing is carried out by referencing the interleaved results of decoding processing. Thus, a BICM-ID technique is constructed.

The extended mapping includes number-of-bits thinning processing from l bits to m bits (m<l) and non-gray mapping. The number-of-bits thinning processing is such that at least one bit out of a predetermined number of bits to be mapped into one symbol is determined with multiple interleaved bits, and at least one bit out of the predetermined number of bits is determined with one of interleaved bits. At this time, preferably, each of the multiple bits being interleaved is used to determine a specific bit to be included in a specific symbol, and will not affect the other bits to be subjected to the non-gray mapping.

If EXIT curves concerning a decoding technique and a demodulation technique are well-matched each other, a loss in a transmission speed is decreased. Accordingly, transmission can be achieved with the Shannon limit attained.

According to another aspect of the invention, since the iterative code is used as a basic code for encoding, a processing quantity to be treated by a decoder can be reduced.

Further, according to still another aspect of the invention, demodulating processing counteracting non-gray mapping and demodulating processing counteracting number-of-bits thinning processing can be separated from each other, and demodulating processing counteracting extended mapping can be minimized. Therefore, even when a modulation technique permitting representation of a large number of values is adopted, a processing quantity arising during demodulating processing counteracting extended mapping can be minimized.

BRIEF DESCRIPTION OF THE DRAWINGS

FIG. 3A shows the configuration thereof for 16 QAM (I=8), FIG. 3B shows the configuration thereof for 64 QAM (I=12), and FIG. 3C shows the configuration thereof for 256 QAM (I=16);

FIG. 29A shows an example of a 8 PSK gray mapping technique, and FIG. 29B shows an example of a 16 QAM gray mapping technique;

FIG. 30 is a diagram showing a non-gray mapping technique in accordance with a related art;

DESCRIPTION OF THE PREFERRED EMBODIMENTS

Figure 1:
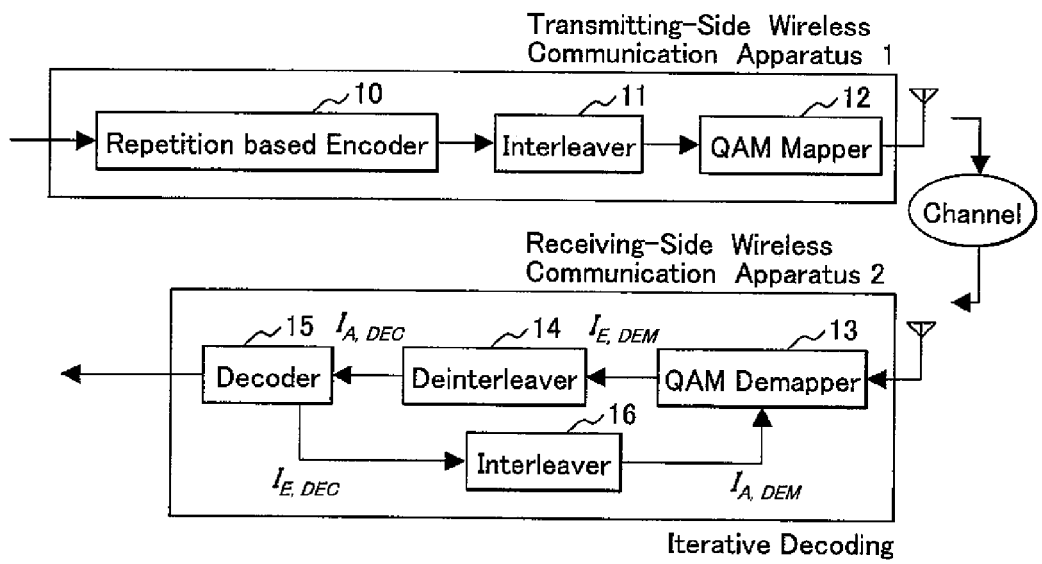
FIG. 1 is a diagram showing the relationship among the configuration of transmitting-side wireless communication apparatus in accordance with the present invention, the configuration of receiving-side wireless communication apparatus, an antenna, and a wireless propagation channel.

FIG. 1 shows a communication system to which the present invention is adapted. In transmitting-side wireless communication apparatus 1, information bits are encoded by an encoder 10 according to a code based on the iterative code, an interleaver 11 reorders bits constituting a code word outputted from the encoder 10, and a modulator 12 modulates the code word and transmits it through an antenna. In contrast, in receiving-side wireless communication apparatus 2, a demapper 13 demodulates a signal received through an antenna, a deinterleaver 14 reorders bits into their original sequence by reversing the processing of the interleaver 11, and a decoder 15 decodes the bits according to a code based on the iterative code. A signal decoded by the decoder 15 is fed to the demapper 13 via an interleaver 16 that performs a reverse of the processing of the deinterleaver 14. The demapper 13 outputs a highly precise result of demodulation on the basis of information fed from the decoder. Thus, the pieces of processing of the demapper 13, deinterleaver 14, decoder 15, and interleaver 16 respectively are iteratively carried out in order to construct a BICM-ID technique.

First Embodiment

Figure 2:
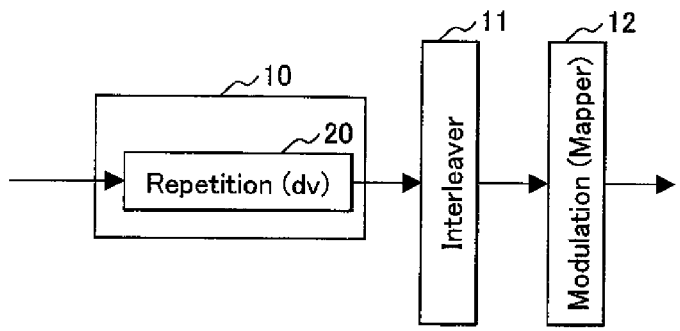
FIG. 2 is a diagram for use in explaining the configuration of the transmitting-side wireless communication apparatus in accordance with a first embodiment.

FIG. 2 shows the configuration of transmitting-side wireless communication apparatus in accordance with the first embodiment. The encoder 10 includes a bit duplicator 20 that performs simple iterative processing alone. Inputted information bits are duplicated into dv bits, and transmitted via the interleaver 11 and modulator 12.

Figure 3A:
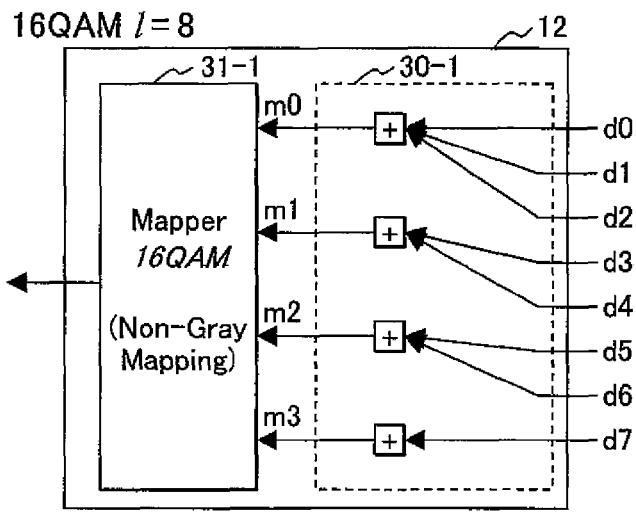
FIG. 3A, FIG. 3B, and FIG. 3C are diagrams for use in explaining the configuration of a modulator.
Figure 3B:
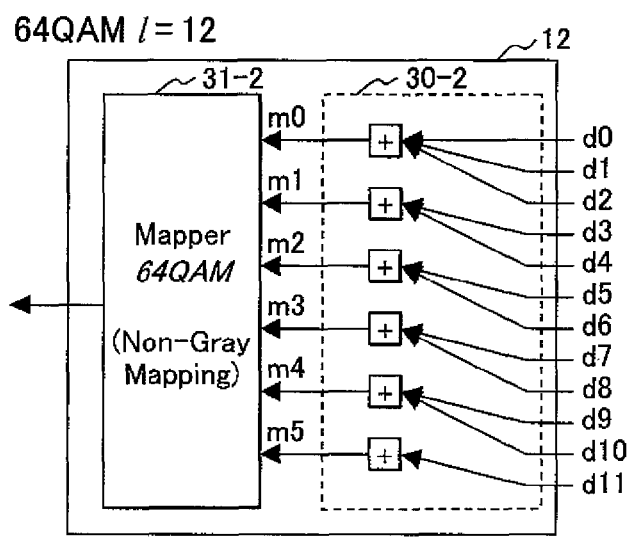
Figure 3C:
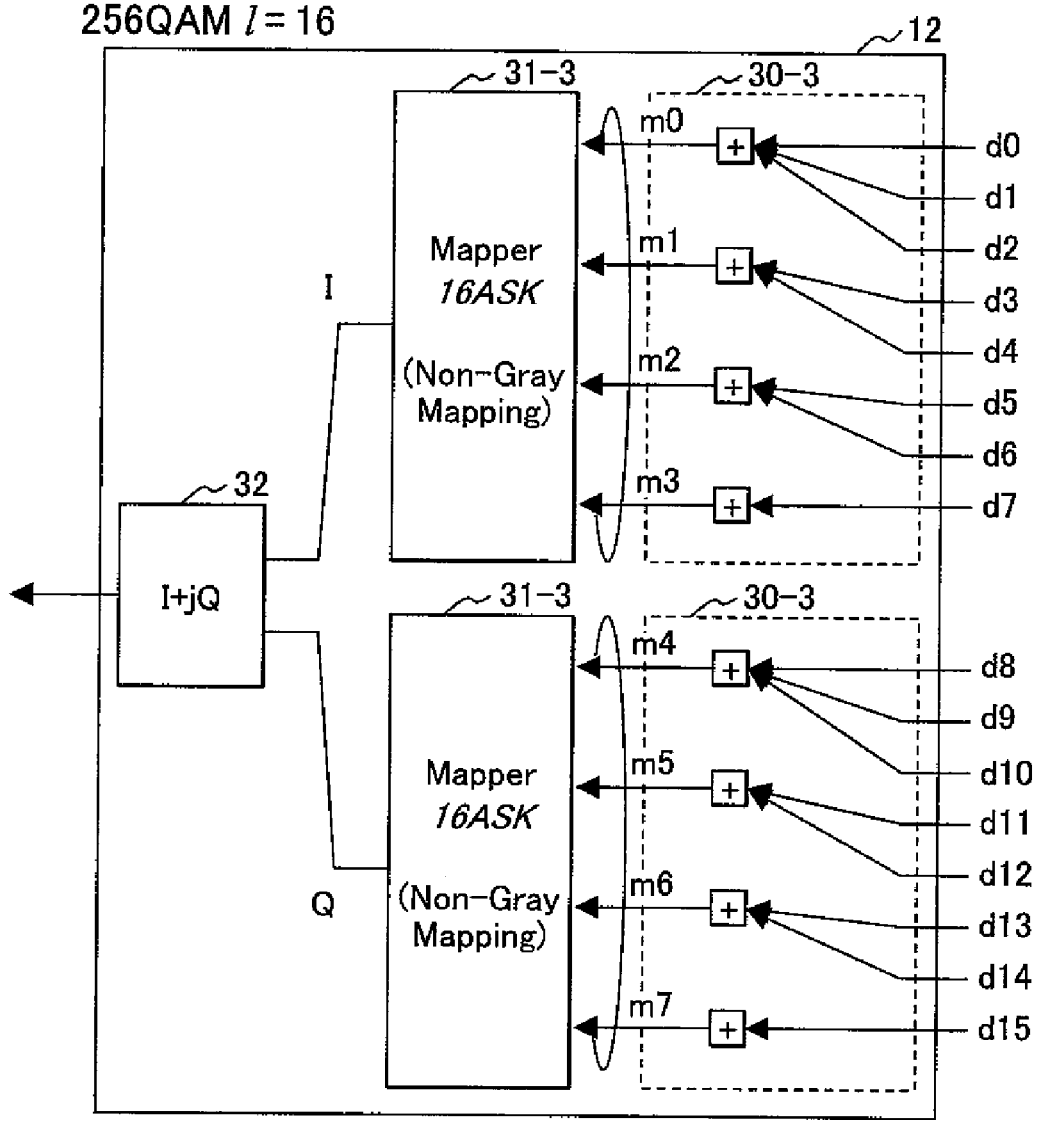

FIG. 3A to FIG. 3C show examples of the configuration of the modulator (mapper) 12. The modulator 12 shown in FIG. 3A to FIG. 3C is an example of a modulator that performs extended mapping. FIG. 3A shows an example in which an 8-bit code word is mapped into a symbol representing any of sixteen constellations (16 QAM (I=8)). FIG. 3B shows an example in which a 12-bit code word is mapped into a symbol representing any of sixty-four constellations (64 QAM (I=12)). FIG. 3C shows an example in which a 16-bit code word is mapped into a symbol representing any of 256 constellations (256 QAM (I=16)). In the examples, the modulator 12 includes a bit thinning processing mapper 30-1, 30-2, or 30-3 and a modulator (mapper) 31-1, 31-2, or 31-3. Further, the modulator shown in FIG. 3C includes an orthogonal modulator that maps I and Q signals on a complex plane. In the modulator 12, the sub-mapper 30-1, 30-2, or 30-3 that performs bit thinning processing thins bits according to a predetermined rule. In the example of 16 QAM (I=8), eight bits of bits d0 to d7 are inputted to the bit thinning processing mapper 30-1, and four bits are outputted. At this time, an exclusive OR (ExOR) of three bits d0, d1, and d2, an exclusive OR of two bits d3 and d4, an exclusive OR of bits d5 and d6, and a bit d7 are outputted. The bit d7 is outputted as it is. This is necessary to acquire some information during initial receiving-side demodulating processing during which no information is fed back from a decoder. The same applied to the examples of 64 QAM (I=12) and 256 QAM (I=16). In the example of 64 QAM, twelve bits are thinned to six bits. In the example of 256 QAM, sixteen bits are divided into two sets of eight bits, and each set of eight bits is thinned to four bits.

In FIG. 3A to FIG. 3C, the bit thinning processing mapper 30 performs bit thinning processing on the interleaved bits of a code word (in FIG. 3A, bits d0 to d7) according to two rules described below, and provides thinned bits (in FIG. 3A, bits m0 to m3).

(1) At least one of bits constituting a code word is modulated as it is but is not computed together with any other bits in order to thin the number of bits. In the examples shown in FIG. 3A and FIG. 3B, the bit refers to the bit d7 in the example of 16 QAM (I=8) or the bit d11 in the example of 64 QAM (I=12).

(2) Thinned bits are obtained through computation of the different interleaved bits of a code word. In FIG. 3A, the bits d0 to d2 are used exclusively for a bit m0, the bits d3 and d4 are used exclusively for a bit m1, the bits d5 and d6 are used exclusively for a bit m2, and the bit d7 is used exclusively for a bit m3. The same bit out of the interleaved bits of the code word will not be computed in order to obtain multiple thinned bits.

The pieces of bit thinning processing shown in FIG. 3A to FIG. 3C conform to the above two rules and can be modified in various manners. The significances of the rules (1) and (2) will be described later.

Thinned bits outputted from the bit thinning processing mapper 30-1, 30-2, or 30-3 are fed to the modulator (mapper) 31-1, 31-2, or 31-3, and then modulated. The modulating processing of the modulator (mapper) 31-1, 31-2, or 31-3 is modulation based on the non-gray mapping other than the gray mapping. In the present invention, the non-gray mapping refers to mapping other than the gray mapping. A reason why the non-gray mapping is adopted lies in that iterative decoding processing is performed on a receiving side. This is intended to output a large amount of information in a situation in which pieces of a priori information are nearly completed, that is, all bits other than a bit to be demodulated are finalized, so that a point of convergence will be associated with the situation in an EXIT chart.

Figure 4A:
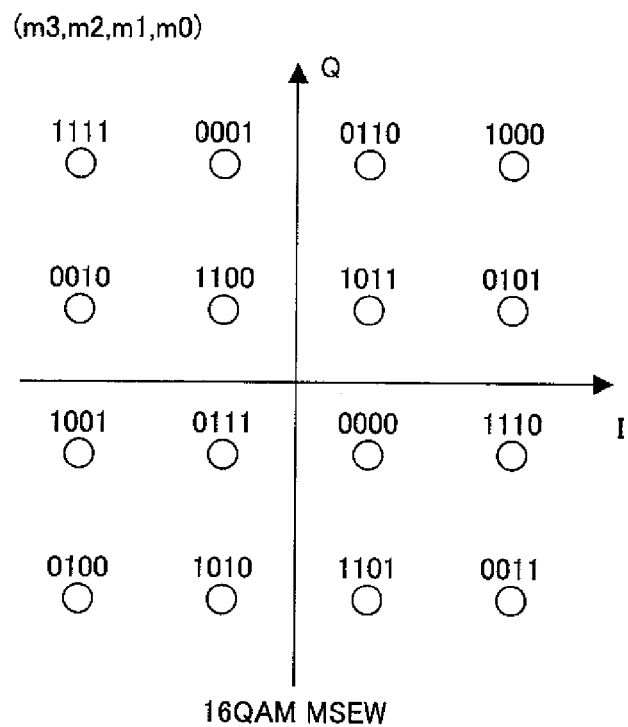
FIG. 4A and FIG. 4B are diagrams showing an example of the first mapping performed by the modulator.
Figure 4B:
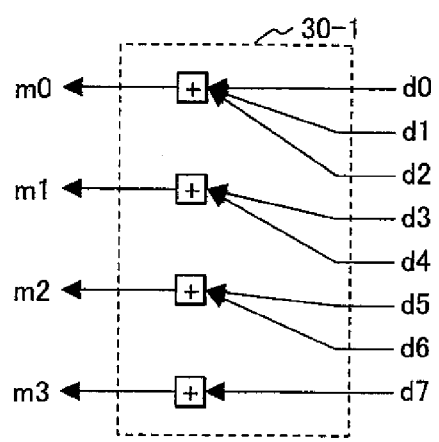
Figures 5A, 5B:
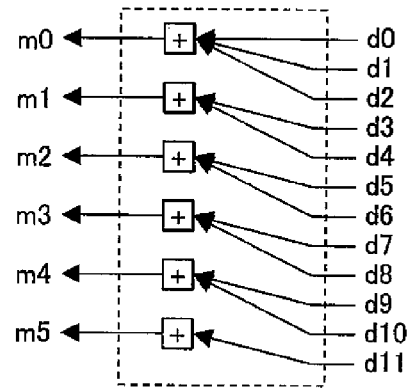
FIG. 5A and FIG. 5B are diagrams showing an example of the second mapping performed by the modulator.
Figure 6A:
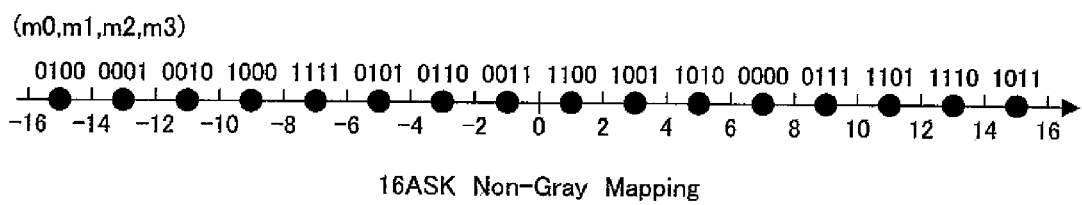
FIG. 6A and FIG. 6B are diagrams showing an example of the third mapping performed by the modulator.
Figure 6B:
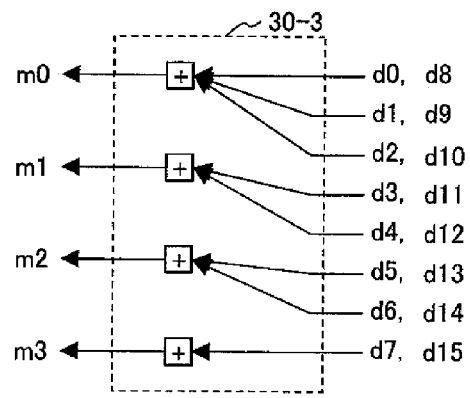

In the example of 16 QAM (I=8) in FIG. 3A, mapping (IEEE GLOBECOM 2003, pp. 3316-3320, 2003) called maximum squared Euclidean weight (MSEW) mapping and shown in FIG. 4A may be adopted as the non-gray mapping. Bits are thinned, for example, as shown in FIG. 4B. In the example of 64 QAM (I=12), mapping shown in FIG. 5A may be adopted. In the mapping shown in FIG. 5A, regularity is not observed. Herein, mapping is achieved by thinning bits, for example, as shown in FIG. 5B and performing retrieval so that a large amount of information will be associated with the right-hand end point of an EXIT curve. In the example of 256 QAM (I=16) shown in FIG. 3C, mapping is not directly performed according to QAM. After the mapper 31-3 designed to perform 16 amplitude shift keying (ASK) that is non-gray mapping modulates I and Q signals, an I+jQ arithmetic processor 32 produces a QAM symbol. As the non-gray 16ASK mapping, mapping shown in FIG. 6A may be adopted. The mapping shown in FIG. 6A is achieved by performing retrieval and therefore has no regularity. Associations of bits may be made, for example, as shown in FIG. 6B.

Figure 7:
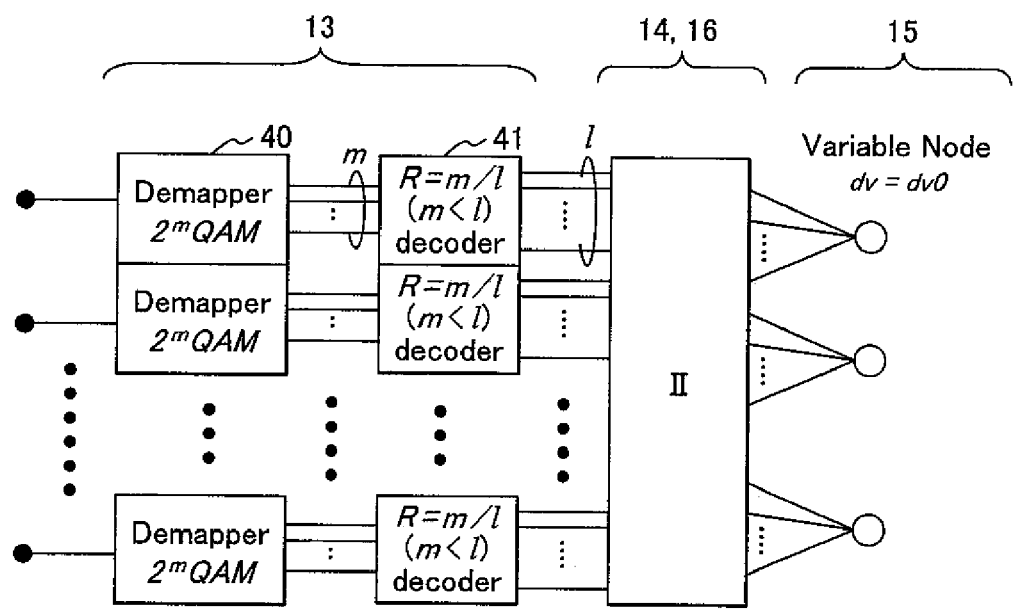
FIG. 7 is a diagram showing the construction of decoding processing to be performed in the first embodiment.
Figure 8:
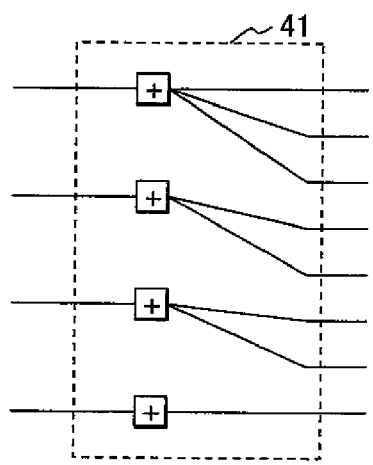
FIG. 8 is a diagram showing the configuration of a bit thinning processing demapper.

Next, processing to be performed in the receiving-side wireless communication apparatus 2 in accordance with the first embodiment will be described in conjunction with FIG. 7. The demapper 13 includes a QAM demapper 40 and a bit thinning processing demapper 41. The deinterleaver 14 is connected to the decoder 15 (variable-node decoder) via the interleaver 16. As mentioned previously, decoding processing is achieved by iteratively performing the pieces of processing of the demapper, deinterleaver, decoder, and interleaver respectively. The bit thinning processing demapper 41 is formed with a check-node decoder. An example shown in FIG. 8 is an example of a configuration counteracting the bit thinning processing mapper 30-1 or 30-3.

Figure 9:
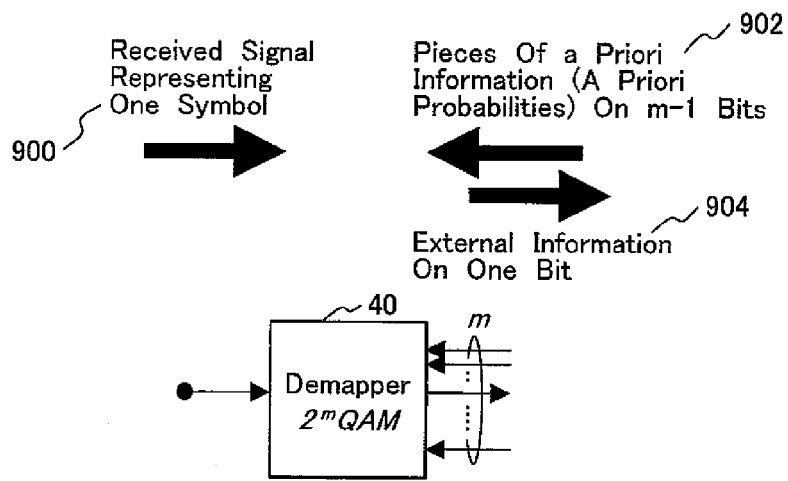
FIG. 9 is a diagram showing a decoding processing procedure employed in the first embodiment.

A received signal that is a received signal 900 is, first, as shown in FIG. 9, subjected to QAM demodulating processing using pieces of a priori information 902, and external information 904 is outputted. At this time, for calculating external information on a certain bit, pieces of a priori information on bits (m−1 bits) other than the bit included in one symbol, and the received signal are used to calculate the external information. The external information is generally outputted in the form of a logarithmic likelihood ratio (LLR). The LLR is a logarithmic expression of a ratio of a probability that a bit may be 0 to a probability that the bit may be 1, and is expressed by an equation (1).

$$L(b) = \log \frac{P(b=0)}{P(b=1)} \quad \text{[Equation 1]}$$

P(b=0) denotes the probability that b may be 0, and P(b=1) denotes the probability that b may be 1.

The other bits of the same symbol are demodulated in the same manner. LLRs concerning m bits are calculated from one received symbol, and then outputted. At the first iterative time, since a priori information is not received from the decoder 15, the LLR is set to 0.

Figure 10A:
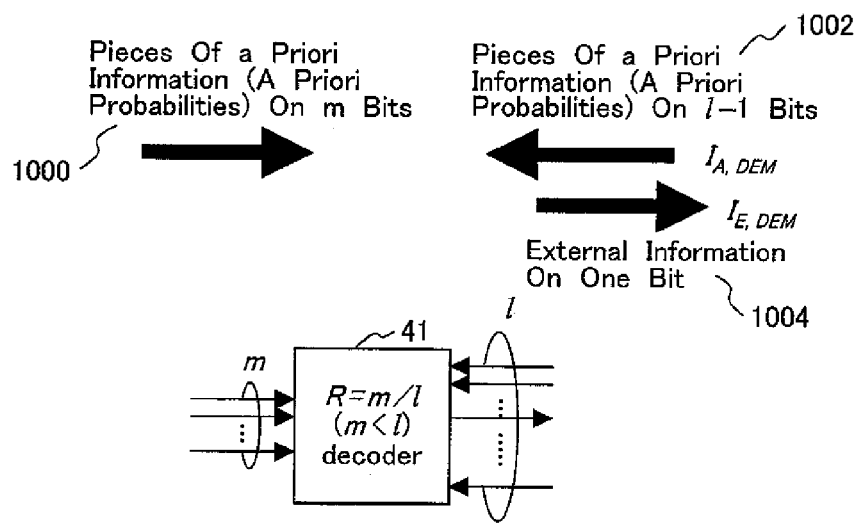
FIG. 10A and FIG. 10B are diagrams showing the decoding processing procedure employed in the first embodiment.
Figure 10B:
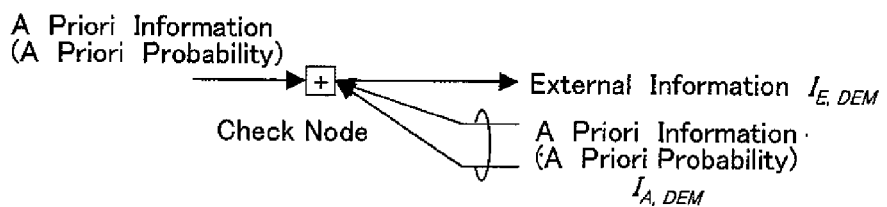

The LLRs concerning m bits of one received symbol are, as shown in FIG. 10A, fed to the bit thinning processing demapper 41 as pieces of a priori information, and then subjected to decoding processing. The decoder counteracting the bit thinning processing mapper 30-1, 30-2, or 30-3 shown in FIG. 3A to FIG. 3C is formed with a check-node decoder (FIG. 10B)). The check-node decoder uses pieces of a priori information 1000 fed from the QAM demapper 40 and a priori information 1002 fed from the interleaver 16 to output external information 1004 on a bit to be decoded. At this time, an LLR concerning the bit and being fed from the interleaver 16 is not used for computation. The external information 1004 is calculated by performing computation, which is expressed by the equation (2) below, on pieces of a priori information 1002 on (l−1) bit fed from the interleaver, and pieces of information on m bits 1000 that are fed as pieces of a priori information and outputted as pieces of external information from the QAM demapper 40.

$$L(u_1 \oplus u_2 \oplus \wedge \oplus u_n) = 2 \mathrm{archtanh}\left(\prod_{i=1}^{a} \tanh\frac{L(u_i)}{2}\right) \quad \text{[Equation 2]}$$

However, $$\tanh x \frac{e^x - e^{-x}}{e^x + e^{-x}} \quad \text{[Equation 3]}$$

$$\mathrm{archtanh} x = \frac{1}{2}\log\frac{1+x}{1-x} \quad \text{[Equation 4]}$$

The present processing is identical to check-node decoding processing to be performed according to a sum-product algorithm known as a decoding technique based on the LDPC code.

More particularly, in a bit thinning processing demapper paired with the bit thinning processing mapper 30-1 and shown in FIG. 4B, the foregoing computation (2) is performed on the bits m0, d1, and d2 in order to calculate external information on the bit d0. Likewise, the computation (2) is performed on pieces of a priori information on the bits m1 and d3 in order to calculate external information on the bit d4. As external information on the bit d7, a priori information on the bit m3 is outputted as it is. The fact that the bit d7 is unsusceptible to bit thinning is quite significant in implementing the present invention. At the initial time of iteration, since a priori information is not fed from the interleaver 16 (LLR is 0), unless the bit d7 making it possible to output external information thereon without a priori information fed from the interleaver 16 is absent, the result of processing expressed by the equation (2) will be null. The result of demodulation will not be fed to the decoder 15. When the bit thinning processing mapper 30-1 is adopted, the result of demodulation that is the bit d7 alone will be fed to the decoder at the initial time of processing.

Figure 11:
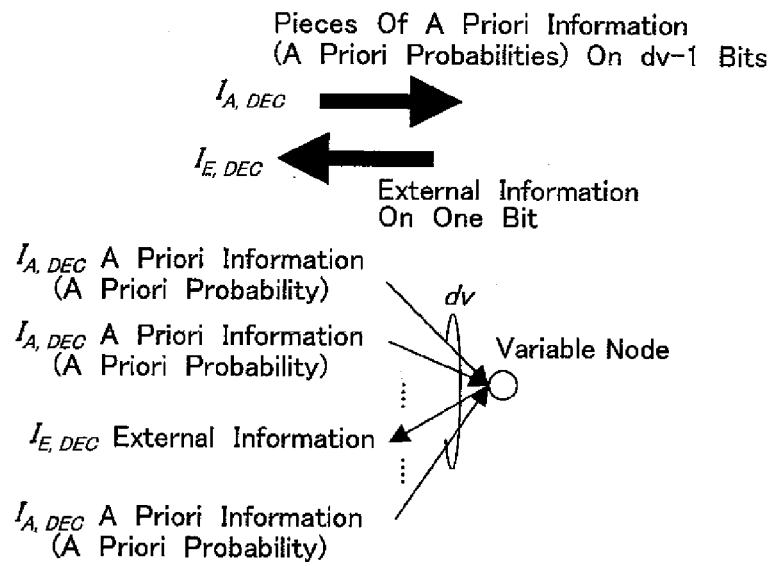
FIG. 11 is a diagram showing a decoding processing procedure employed in the first embodiment.

Through the foregoing processing, external information on one bit included in one symbol is calculated by the demapper 13, and fed to the deinterleaver 14. The external information whose bits are reordered by the deinterleaver is fed as a priori information to the decoder 15. The decoder 15 performs decoding processing counteracting the processing of the bit duplicator 20 included in the transmitting-side encoder 10. Assuming that the bit duplicator 20 duplicates one bit to produce dv bits, dv LLRs concerning the same signal are obtained as pieces of a priori information by the deinterleaver 14, as shown in FIG. 11. Therefore, the decoding processing is equivalent to variable-node decoding processing expressed by an equation (5) below.

$$L(u_1 + u_2 + \wedge + u_n) = \sum_{i=1}^{n} L(u_i) \quad \text{[Equation 5]}$$

The present processing is identical to variable-node decoding processing to be performed according to the sum-product algorithm known as a decoding technique based on the LDPC code. Even in this case, similarly to the check-node decoding processing, pieces of external information on bits other than a bit that is an object of external information calculation are computed. Therefore, computation of calculating external information on one bit using pieces of a priori information on dv−1 bits is carried out dv times in order to calculate, using the equation (5), the external information on each of duplicate bits.

Figure 12A:
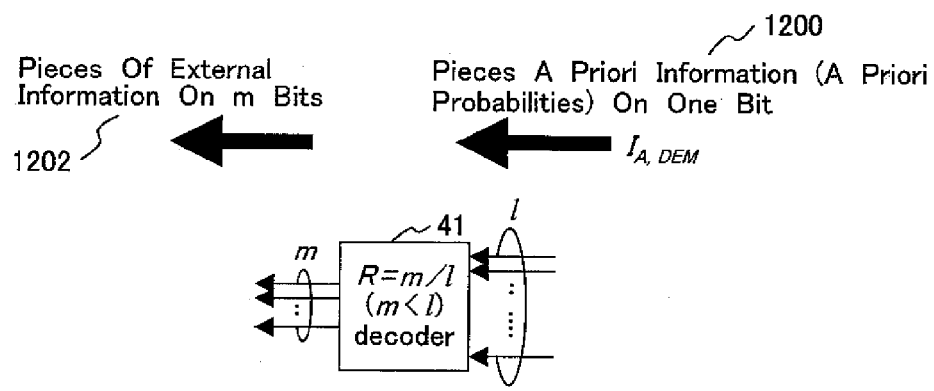
FIG. 12A and FIG. 12B are diagrams showing the decoding processing procedure employed in the first embodiment.
Figure 12B:
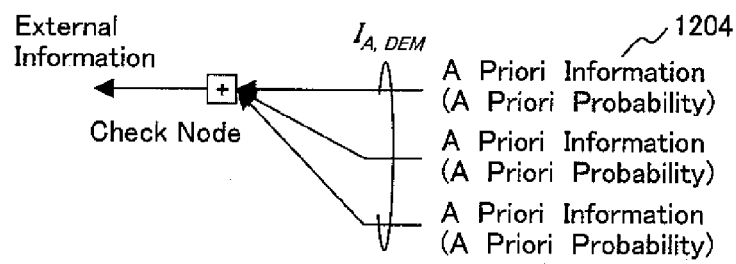

Dv pieces of external information on one bit calculated by the variable-node decoder are fed to the bit thinning processing demapper 41 via the interleaver 16. The bit thinning processing demapper 41 is formed with a check-node decoder as mentioned previously, and, as shown in FIG. 12A, calculates pieces of external information 1202 on m bits using a priori information 1200 on one bit. More particularly, as shown in FIG. 12B, computation expressed by the equation (2) is performed on pieces of a priori information 1204 on multiple bits having undergone exclusive OR during bit thinning processing. In the case of the bit thinning processing mapper 30-1 shown in FIG. 4B, pieces of a priori information on bits d0, d1, and d2 are used to calculate external information on a bit m0. For a bit m1, pieces of a priori information on bits d3 and d4 are computed. For a bit m3, a priori information on a bit d7 is outputted as it is. Thus obtained pieces of external information on m bits included in one symbol are fed to the QAM demapper 40. The aforesaid QAM demodulating processing shown in FIG. 9 is then carried out.

The pieces of processing shown in FIG. 9 to FIG. 12 are iteratively carried out. After the pieces of processing are iterated by the number of times permitting them to converge, the decoder 15 performs processing shown in FIG. 13 so as to calculate a result of decoding at each of the variable nodes thereof. The result of decoding is provided as an LLR that is an a posteriori probability. Pieces of a priori information on all dv bits are computed according to the equation (5) in order to obtain a 1-bit information bit output.

According to the first embodiment, a BICM-ID technique can be readily constructed with a combination of simple iterative encoding and extended mapping. As described previously, what is significant in the BICM-ID technique is whether EXIT curves are matched each other. The EXIT curve concerning an iterative code employed in the first embodiment basically slopes upwards as it goes rightward and has a downward convex part (see the dashed lines in FIG. 22 to FIG. 26). Therefore, a modulation technique that matches the iterative code employed in the BICM-ID technique is expressed with a curve which slopes upwards as it goes rightward and has a downward convex part.

As for the modulator 12 that includes a bit thinning processing mapper and a QAM mapper which performs non-gray mapping and that is shown in any of FIG. 3A to FIG. 3C, the modulation is expressed with a curve that slopes upwards as it goes rightward and has a downward convex part as indicated with any of the solid lines in FIG. 22 to FIG. 26. When the modulation is combined with iterative encoding, a BICM-ID technique suffering a small loss in a rate can be constructed. The modulation technique expressed with a curve that slopes upwards as it goes rightward and has a downward convex part may be realized by applying QAM, which employs non-gray mapping that permits representation of a large number of values, to a low signal-to-noise ratio region. In this case, if the modulation technique maps the number of bits that is twice larger than the number of bits capable of originally being transmitted per symbol, the EXIT curve concerning the modulation technique well matches the EXIT curve concerning the iterative code.

However, under an environment in which a signal-to-noise ratio is, for example, about 20 dB, six bits can theoretically be transmitted per a symbol. In order to realize an EXIT curve that slopes upwards as it goes rightward and have a downward convex part, about twelve bits have to be mapped into one symbol. This is unfeasible because an unrealistic modulation technique of 4096 ($2^{12}$) QAM has to be adopted for transmission of the number of bits that can originally be transmitted by performing 64 ($2^6$) QAM. When extended mapping in which twelve bits are mapped is adopted as 64 QAM, an EXIT curve having nearly the same shape can be plotted. In order to plot an EXIT curve having a preferred shape, mapping has to be designed by performing retrieval as described in IEEE PIMRC, 2006. Mapping to be attained through retrieval has no regularity, and demodulating processing to be performed by a demapper makes it necessary to perform probability computation on all of 4096 possibilities. This results in a very large processing quantity. When the modulation technique of 256 QAM (I=16) shown in FIG. 3C is adopted, twelve bits are mapped according to 256 QAM. Since the I and Q signals are orthogonal to each other, the I and Q signals are separated from each other and converted by performing two pieces of demodulating processing according to 16 ASK. Supposing the bit thinning mapper 30-3 and non-gray 16 ASK mapper 31-3 are used in combination, the pieces of processing performed by the mappers correspond to extended mapping. For each of the I and Q signals, 256 constellations are conceivable. In the present invention, since the bit thinning mapper 30-3 and 16 ASK mapper 31-3 are separated from each other, 16 ASK demapping processing corresponds to probability computation to be performed on sixteen possibilities. Since the processing of the bit thinning demapper 41 is achieved by performing computation, which is expressed by the equation (2), on each of the I and Q signals eight times, demapping processing can be accomplished by treating a very small processing quantity. Since the encoder adopts a very simple iterative code, a processing quantity to be treated during decoding processing to be performed in the receiving-side wireless communication apparatus can be minimized.

In the 64 QAM (I=12) and 256 QAM (I=16) modulators shown in FIG. 3B and FIG. 3C, mapping deduced from retrieval is, similarly to the one described in IEEE PIMRC, 2006, adopted. Since the number of values to be represented by modulated data is relatively small, that is, 64 or 16 (×2), the processing quantity to be treated during the aforesaid probability computation is small.

In general, similarly to the bits m0, m1, and m2 to be treated by the bit thinning processing mapper 30-1 shown in FIG. 4B, at least one of a predetermined number of bits to be mapped into one symbol by the non-gray mapping modulator (31-1, 31-2, or 31-3) is determined with multiple interleaved bits. This is effective in realizing an EXIT curve, which slopes upwards as it goes rightward and has a downward convex part, as long as a signal-to-noise ratio is relatively high. A modulation technique permitting representation of a relatively small number of values may be adopted as the technique to be implemented in the non-gray mapping modulator (31-1, 31-2, or 31-3). Therefore, the mapper performing extended mapping that is a combination of non-gray mapping and bit thinning processing will prove effective in realizing an EXIT curve, which slopes upwards as it goes rightward and has a downward convex part, despite a small processing quantity to be treated by the paired demodulator (demapper) 13. As a bit m3 to be treated by the bit thinning processing mapper 30-1 shown in FIG. 4B is determined with the bit d7 alone, so at lease one of a predetermined number of bits to be mapped into one symbol by the non-gray mapping modulator (31-1, 31-2, or 31-3) is determined with one of interleaved bits.

Accordingly, the left-hand end of an EXIT curve concerning the demodulator (demapper) 13 is prevented from being null, and information is outputted even at an initial time of iterative decoding processing. In general, the aforesaid bit need not exist in all modulated symbols, but may exist at a certain ratio among bits constituting one code word. Therefore, as long as it does not matter that mapping processing and demapping processing are varied depending on a symbol, at least one of a predetermined number bits to be mapped into a symbol to be extracted at a predetermined ratio from multiple symbols derived from one code word is determined with multiple interleaved bits. At least one of the predetermined number of bits to be mapped into the symbol to be extracted at the predetermined ratio may be determined with one of interleaved bits.

As a method of preventing the left-hand end of the EXIT curve concerning the demodulator (demapper) 13 from being null, in addition to the aforesaid method of determining at least one of a predetermined number of bits, which are mapped into one symbol, with one of interleaved bits, there is another method. Namely, LLRs derived from pieces of a priori information (a priori probabilities) to be fed to the demapper may be prevented from all being 0s. As the simplest method, when known bits are mixed and sent, the LLRs of the known bits become non-null. A means that does not allow a bit included in a code word to be 0 or 1 at a probability of 1/2 but allows the bit to be 0 or 1 all the time (for example, a means for performing precoding prior to encoding) may be employed. Even in this case, preferably, each of the multiple interleaved bits (d0, d1, etc.) is used to determine a specific bit (m0, m1, etc.) to be included in a specific symbol, and will not affect the other bits to be included in the symbol through non-gray mapping. Multiple bits obtained from the same symbol during demapping processing 13 have undergone the same noise and interference, but are not regarded as independent events. The LLRs obtained from independent events are subjected to the computations expressed by the equations (2) and (5). When bits are not regarded as independent events, the equations (2) and (5) are not established. Therefore, when one bit (d0, d1, etc.) affects the other bits (m0, m1, etc.) to be included in the same symbol, the LLRs of bits (d0, d1, etc.) to be fed to the decoder 15 have to be calculated using multiple bits (m0, m1, etc.). This poses a problem in that calculation of the LLRs becomes complex. Therefore, the bit thinning mapper 30-1 included in the present invention and shown in FIG. 4B is designed so that the bits d0, d1, d2, d3, d4, d5, d6, and d7 affect the bits m0, m0, m0, m1, m1, m2, m2, and m3 respectively. From the above viewpoint, when each of multiple interleaved bits (d0, d1, etc.) is used to determine a specific bit (m0, m1, etc.) to be included in a certain symbol, the same bit may be used to determine any other symbol. However, a propagation channel in which a delayed wave exists causes symbols, which temporally adjoin to each other, to interfere with each other. Depending on the nature of an extraneous interference, the adjoining symbols may have undergone correlative interferences. Therefore, each of multiple interleaved bits (d0, d1, etc.) is preferably used to determine a specific bit (m0, m1, etc.) of a specific symbol.

Second Embodiment

Figure 13:
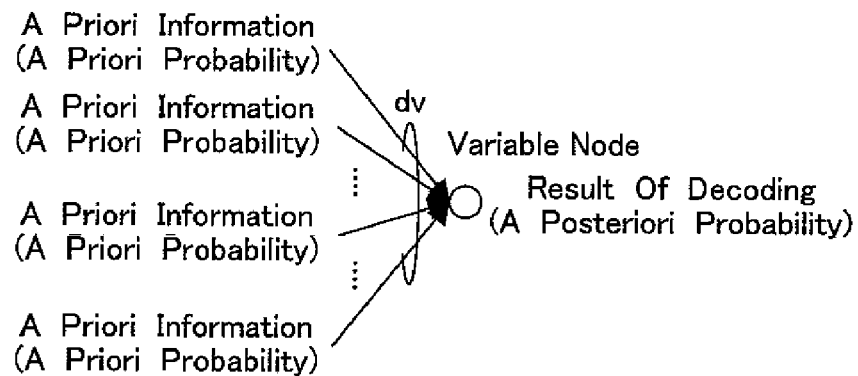
FIG. 13 is a diagram showing the decoding processing procedure employed in the first embodiment.
Figure 14:
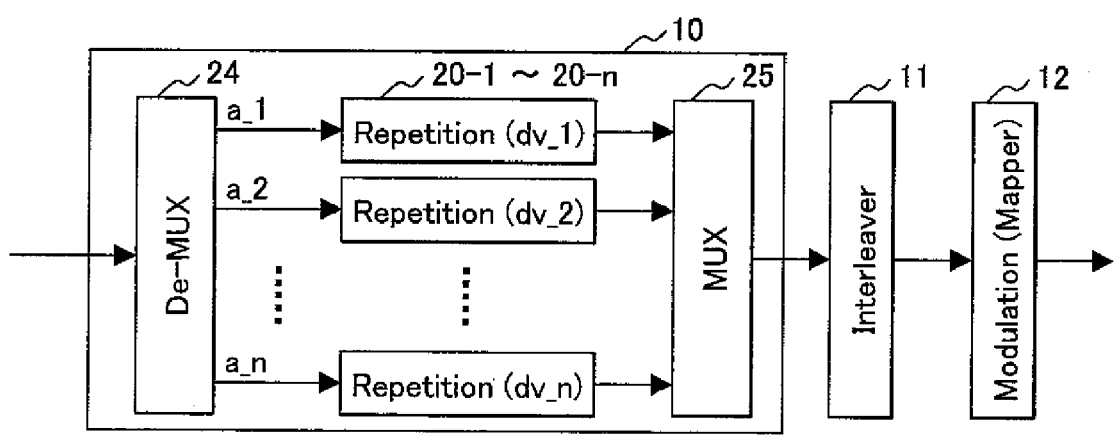
FIG. 14 is a diagram for use in explaining the configuration of transmitting-side wireless communication apparatus in accordance with a second embodiment.
Figure 15:
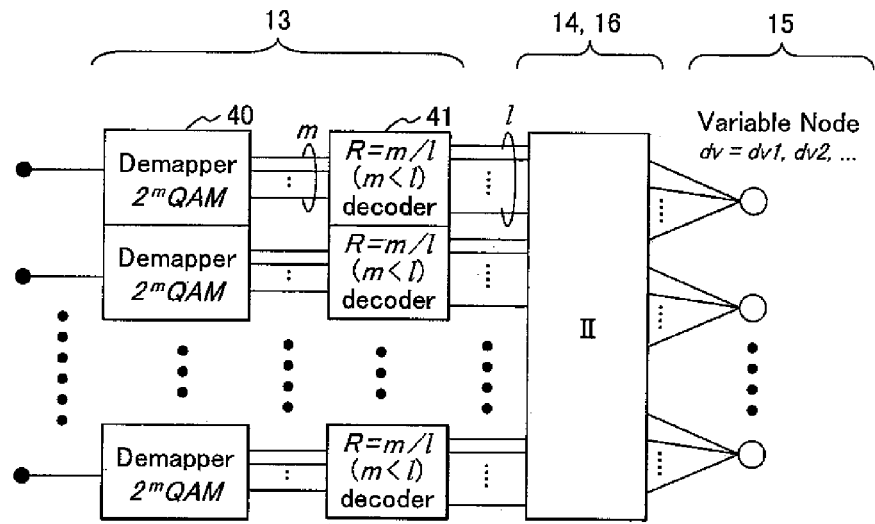
FIG. 15 is a diagram showing the construction of decoding processing to be performed in the second embodiment.

Next, a second embodiment will be described below. In the second embodiment, an iterative code is used for encoding. However, in the first embodiment, all information bits are encoded iteratively dv times. In contrast, as shown in FIG. 14, bit duplicators 20-1 to 20-n for which different numbers of times of iteration are designated are used at a predetermined ratio (a_1, a_2, etc., and a_n). EXIT curves concerning iterative codes specifying the different number of times of iteration have different shapes. The larger the number of times of iteration is, the downward convexity becomes outstanding. Therefore, when the multiple numbers of times of iteration are used in combination, the freedom in determining the shape of the EXIT curve is expanded. The EXIT curve that well matches a modulation technique can be realized. Decoding processing employed in the second embodiment is, as shown in FIG. 15, nearly identical to that shown in FIG. 7 and employed in the first embodiment. A difference lies in the degree (dv1, dv2, etc.) of an equation to be treated by each variable node. Therefore, decoding is achieved by varying the degree of an equation expressing the processing to be performed at each variable node, which is shown in FIG. 11 or FIG. 13 and employed in first embodiment, according to information bits. A decoding processing quantity is thought to be identical to that in the first embodiment.

Third Embodiment

Figure 16:
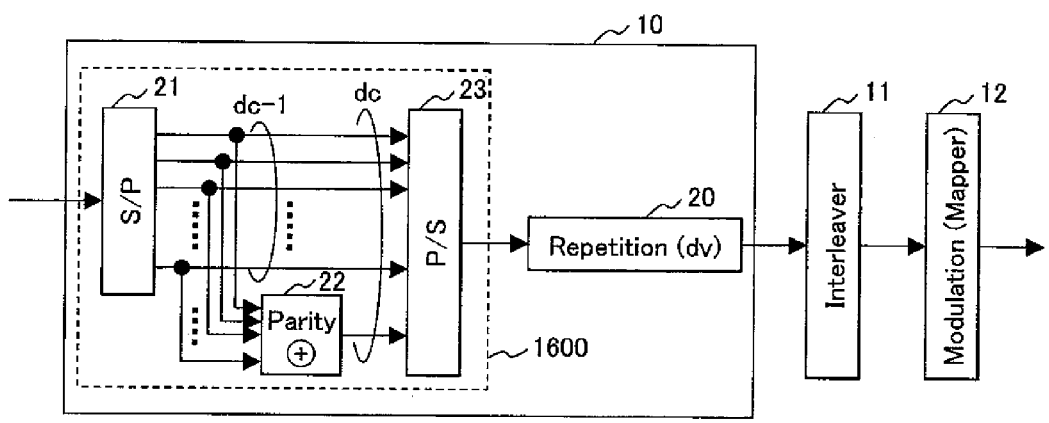
FIG. 16 is a diagram for use in explaining the configuration of transmitting-side wireless communication apparatus in accordance with a third embodiment.
Figure 17:
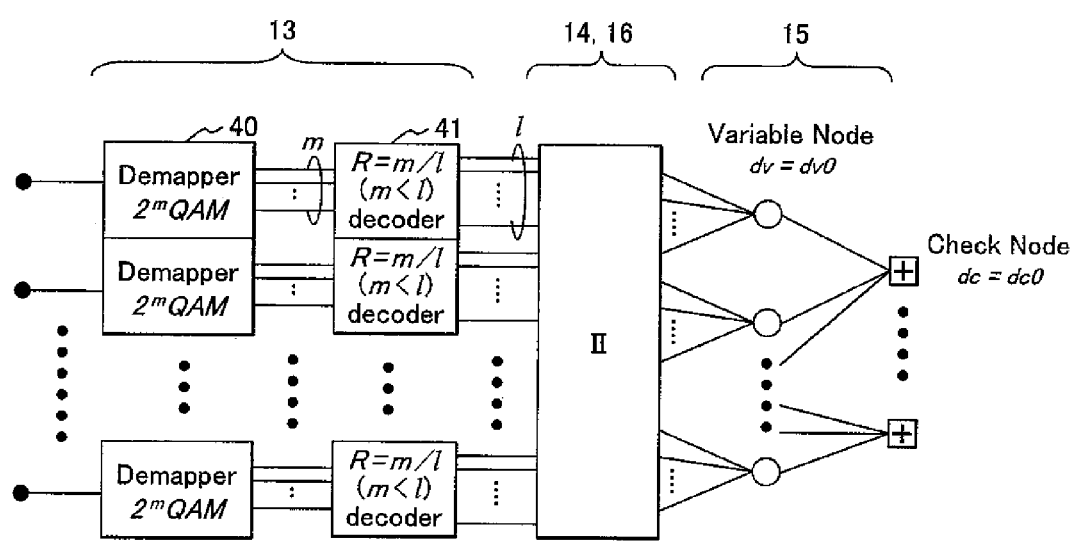
FIG. 17 is a diagram showing the construction of decoding processing to be performed in the third embodiment.

Next, a third embodiment will be described below. In the third embodiment, a parity bit is added prior to encoding to be performed according to an iterative code. As shown in FIG. 16, in the encoder 10, a parity appending block 1600 that produces a parity bit from (dc−1) information bits and outputs dc bits which include information bits is disposed in a stage preceding the bit duplicator 20 that performs iterative encoding. The parity appending block 1600 includes serial-parallel converters (21 and 23) for bits and an exclusive OR gate 22. Decoding processing employed in the third embodiment is, as shown in FIG. 17, achieved by connecting a check-node decoder, which computes a parity bit, to a variable-node decoder. As a decoding procedure, pieces of processing shown in any of FIG. 18A to FIG. 18C are substituted for those shown in FIG. 11.

Figure 18A:
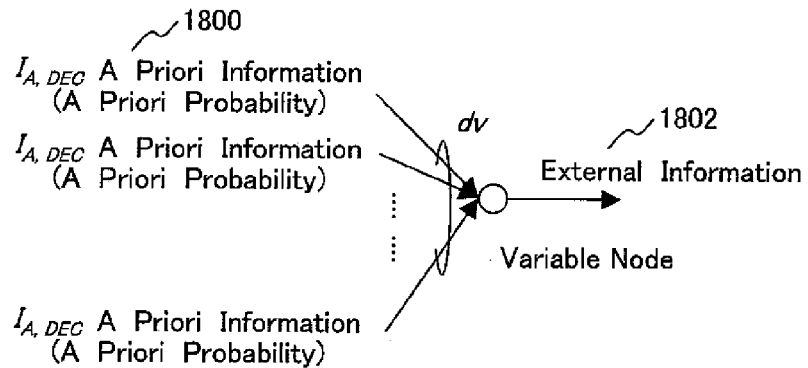
FIG. 18A, FIG. 18B, and FIG. 18C are diagrams showing a processing procedure to be followed by a decoder included in the third embodiment.

In FIG. 18A, pieces of a priori information 1800 fed from the deinterleaver 14 are subjected to the computation expressed by the equation (5) in order to calculate external information 1802. The calculated external information is inputted as a priori information to the check-node decoder 1804 shown in FIG. 18B, and subjected to the computation expressed by the equation (2) in order to calculate external information to be fed back to each variable node. The external information outputted from the check-node decoder shown in FIG. 18(B) is fed back as a priori information 1806 to the variable-node decoder shown in FIG. 18C. Each variable node uses the priori information to calculate external information 1808 (equation (5)) to be fed back to the demapper.

Figure 18B:
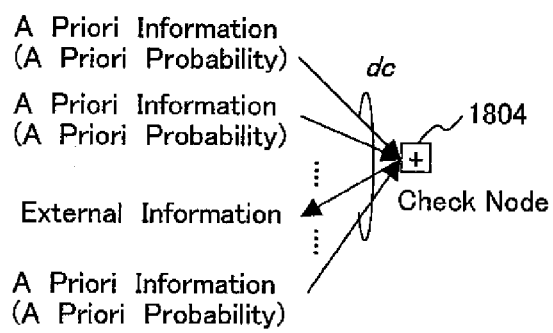
Figure 18C:
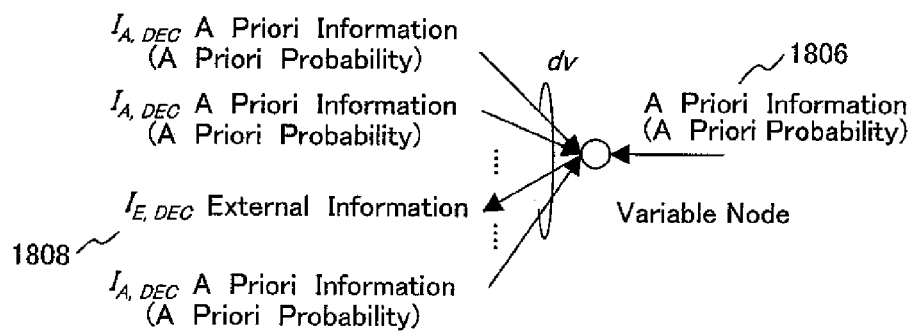

In the third embodiment, compared with the first embodiment, since the pieces of processing shown in FIG. 18A and FIG. 18B are added, a volume of decoding processing increases a bit. Since a parity bit is appended, the right-hand end of an EXIT curve concerning the decoder is approached to 1. This is effective in reducing a remaining error left at the time of convergence of the decoding processing.

Fourth Embodiment

Figure 19:
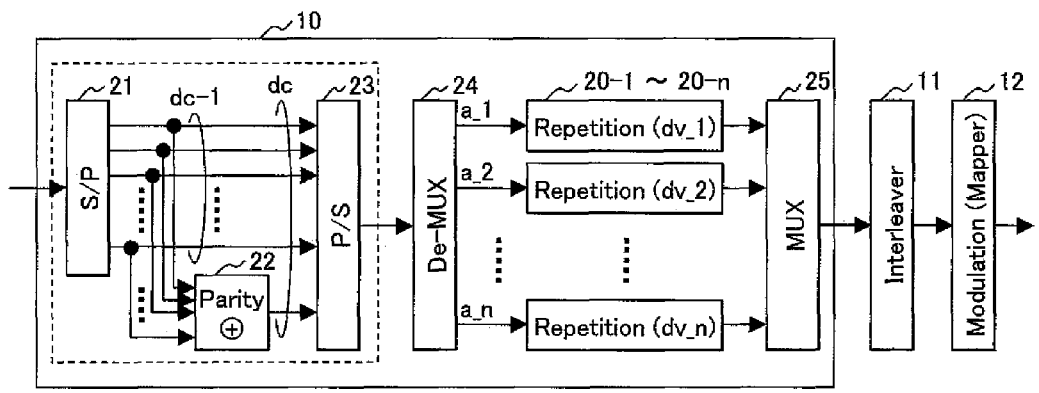
FIG. 19 is a diagram for use in explaining the configuration of transmitting-side wireless communication apparatus in accordance with a fourth embodiment.
Figure 20:
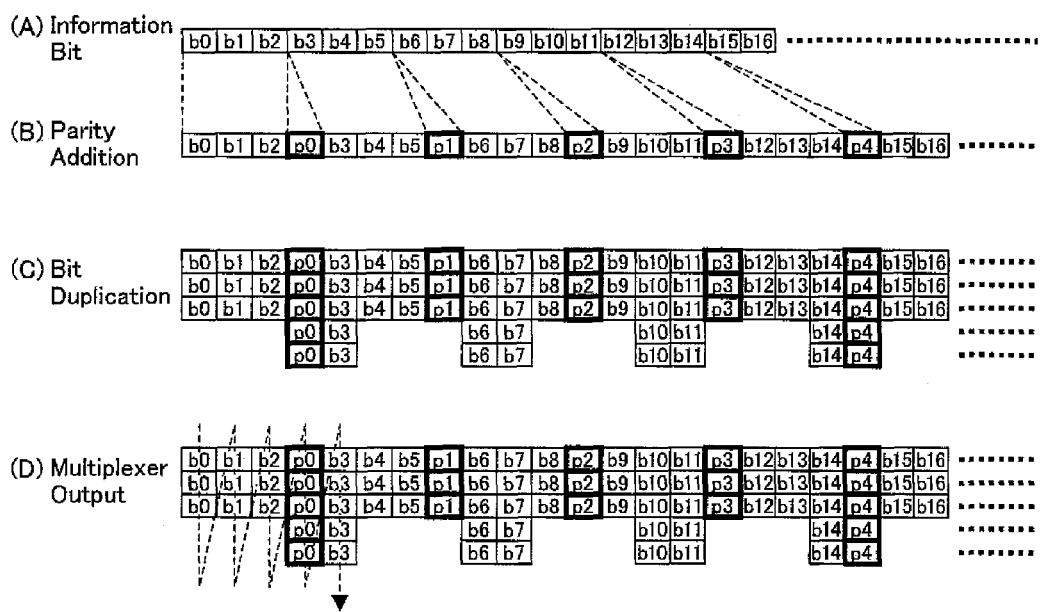
FIG. 20 is a diagram for use in explaining a processing procedure to be followed by an encoder included in the fourth embodiment.
Figure 21:
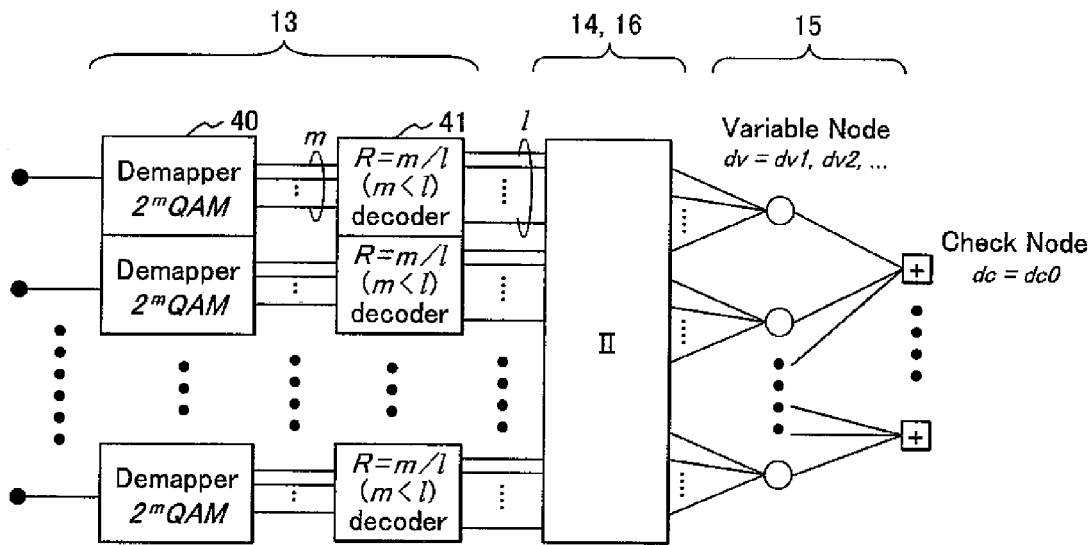
FIG. 21 is a diagram showing the construction of decoding processing to be performed in the fourth embodiment.

A fourth embodiment shown in FIG. 19 is obtained by combining the second and third embodiments. The fourth embodiment has both the advantage of the second embodiment that the freedom in designing an EXIT curve concerning a decoder is expanded, and the advantage of the third embodiment that a remaining error is reduced. The configuration shown in FIG. 19 looks complex. However, actual processing is, as shown in FIG. 20, achieved by (B) adding a parity bit to (A) an information bit string, duplicating bits at a predetermined ratio (in the example shown in FIG. 20C, 60% when the number of times of iteration dv is 3, and 40% when the number of times of iteration dv is 5), and (D) feeding the bits to the interleaver 11 in a sequence indicated with a dot line. Counteracting decoding processing is expressed in FIG. 21, and a decoding processing quantity is nearly identical to that to be treated in the third embodiment and shown in FIG. 17.

Figures 27, 28:
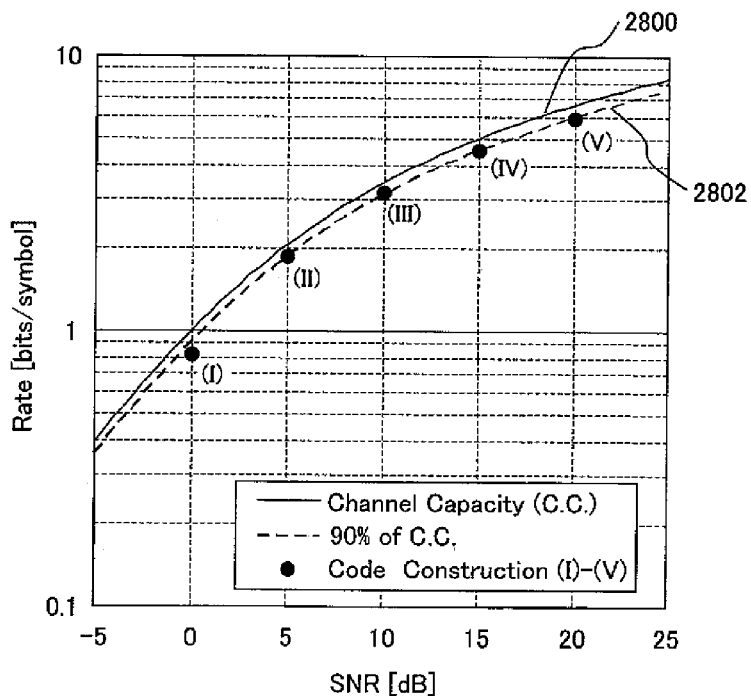
FIG. 27 is a diagram showing an example of an encoding technique employed in the fourth embodiment.
FIG. 28 is a diagram showing a transfer rate employed in the fourth embodiment.
Figure 29A:
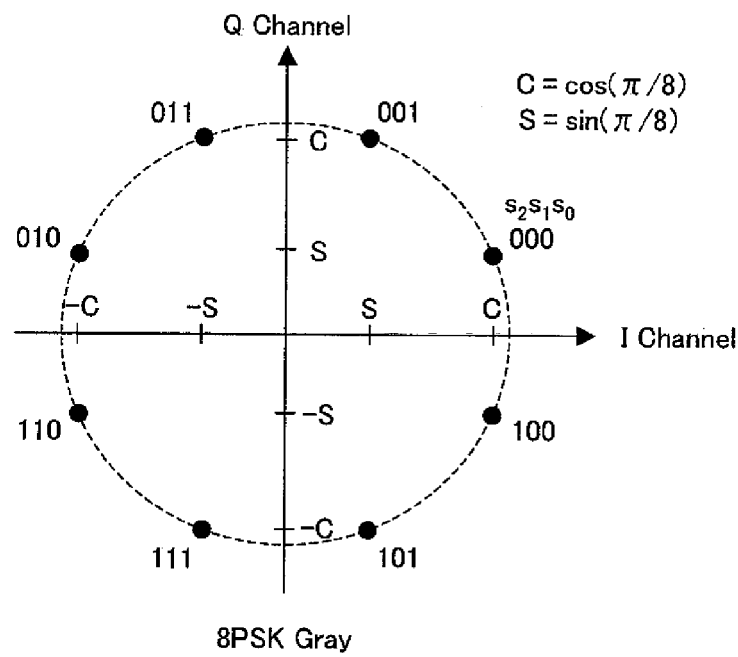
FIG. 29A and FIG. 29B are diagrams showing gray mapping techniques in accordance with related arts.
Figure 29B:
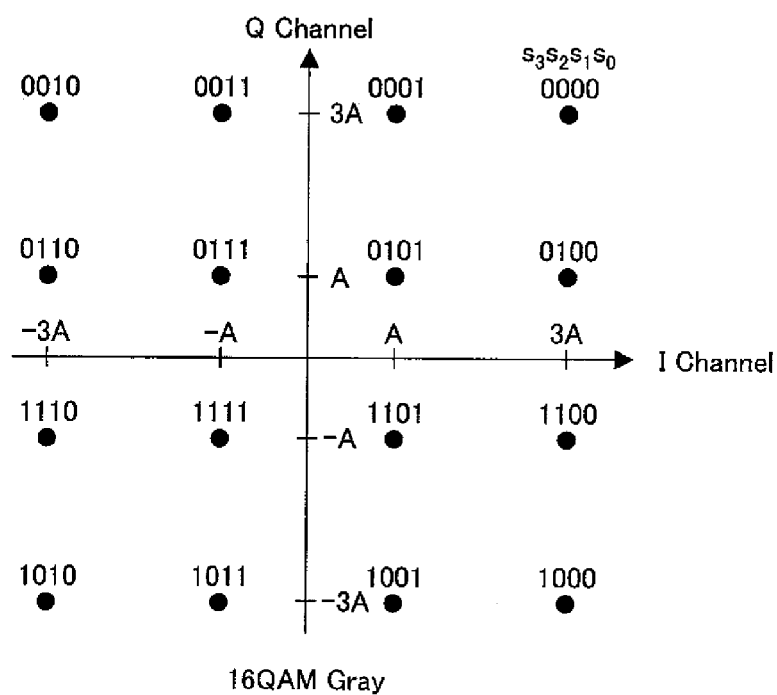

The specialty of the fourth embodiment will be described by taking for instance cases expressed with EXIT charts shown in FIG. 22 to FIG. 26. In any of the cases, a modulator performing 256 QAM (I=16) shown in FIG. 3 is adopted as the modulator (mapper) 12. An encoder has the configuration shown in FIG. 19. A parity bit appending ratio and the number of times of iteration are listed in FIG. 27. FIG. 27 lists code constructions (code types) that match EXIT charts concerning the demodulator shown in FIG. 19. The code constructions I to V are the code constructions that match the EXIT charts in cases where a signal-to-noise ratio is 0, 5, 10, 15, or 20 dB. By selecting an appropriate one of the code constructions, an EXIT curve (solid line) concerning the demapper and an EXIT curve (dashed line) concerning the decoder are well matched each other over a wide range of signal-to-noise ratios from 0 dB to 20 dB.

Figure 22:
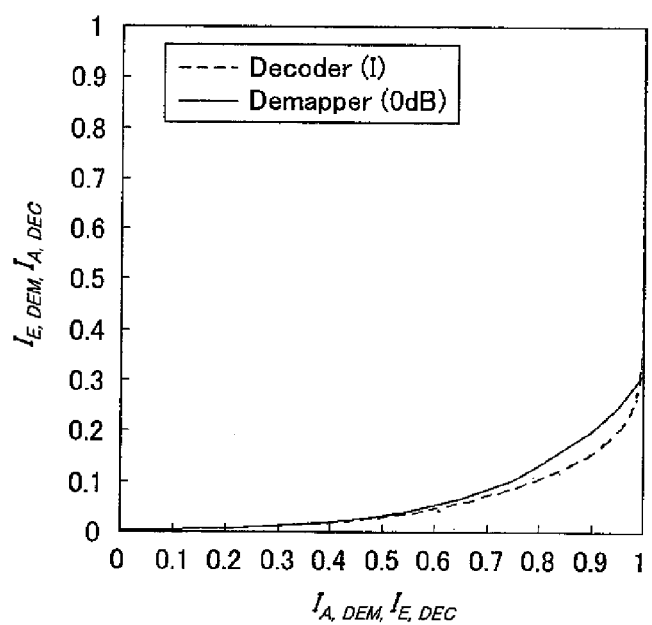
FIG. 22 is a diagram showing an EXIT chart concerning the fourth embodiment.
Figure 23:
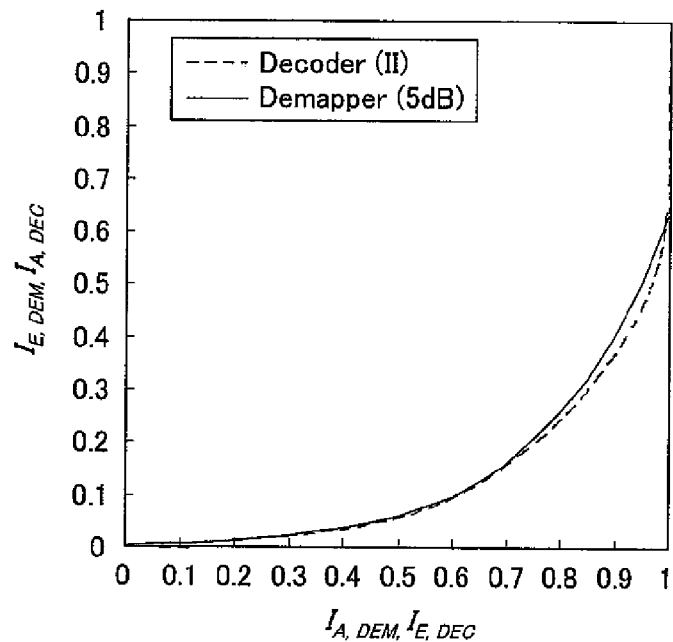
FIG. 23 is a diagram showing an EXIT chart concerning the fourth embodiment.
Figure 24:
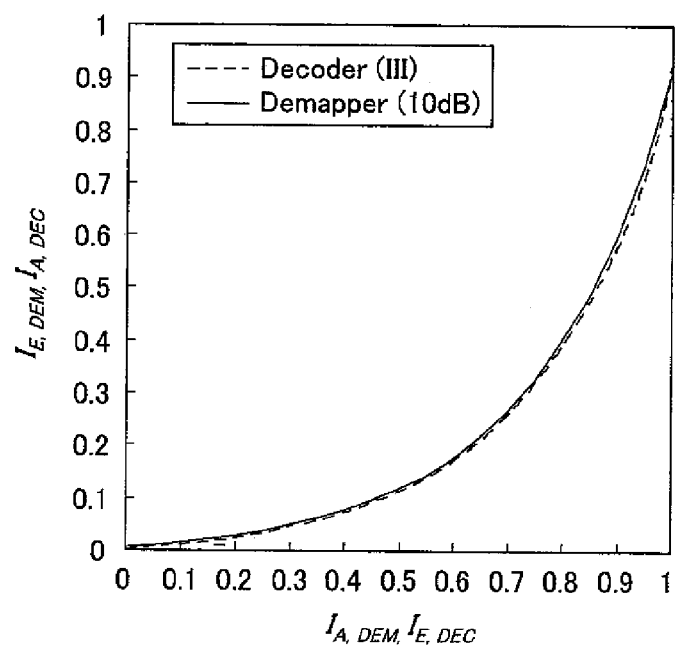
FIG. 24 is a diagram showing an EXIT chart concerning the fourth embodiment.
Figure 25:
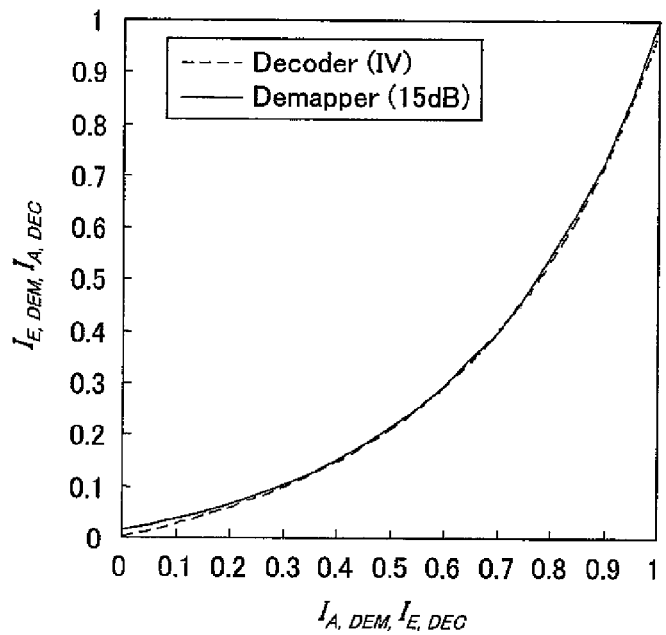
FIG. 25 is a diagram showing an EXIT chart concerning the fourth embodiment.
Figure 26:
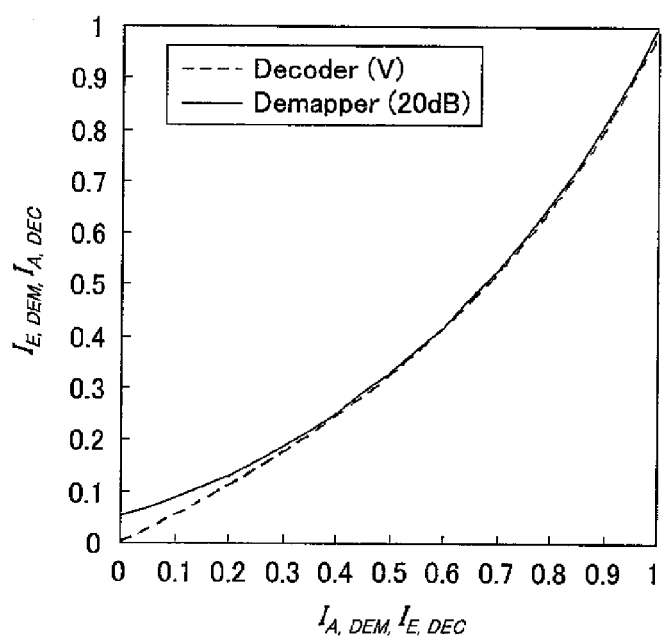
FIG. 26 is a diagram showing an EXIT chart concerning the fourth embodiment.
Figure 31:
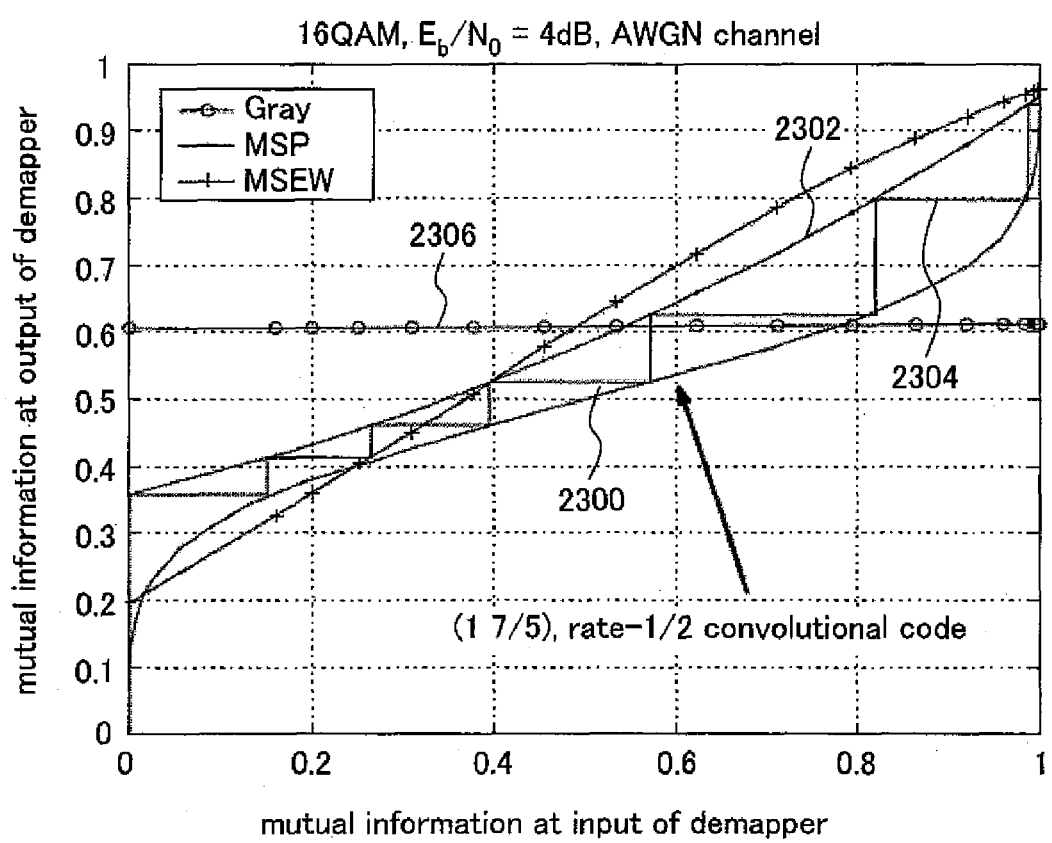
FIG. 31 is a diagram showing an EXIT chart concerning a BICM-ID technique described in IEEE GLOBECOM 2003, pp. 3316-3320, 2003.
Figure 32:
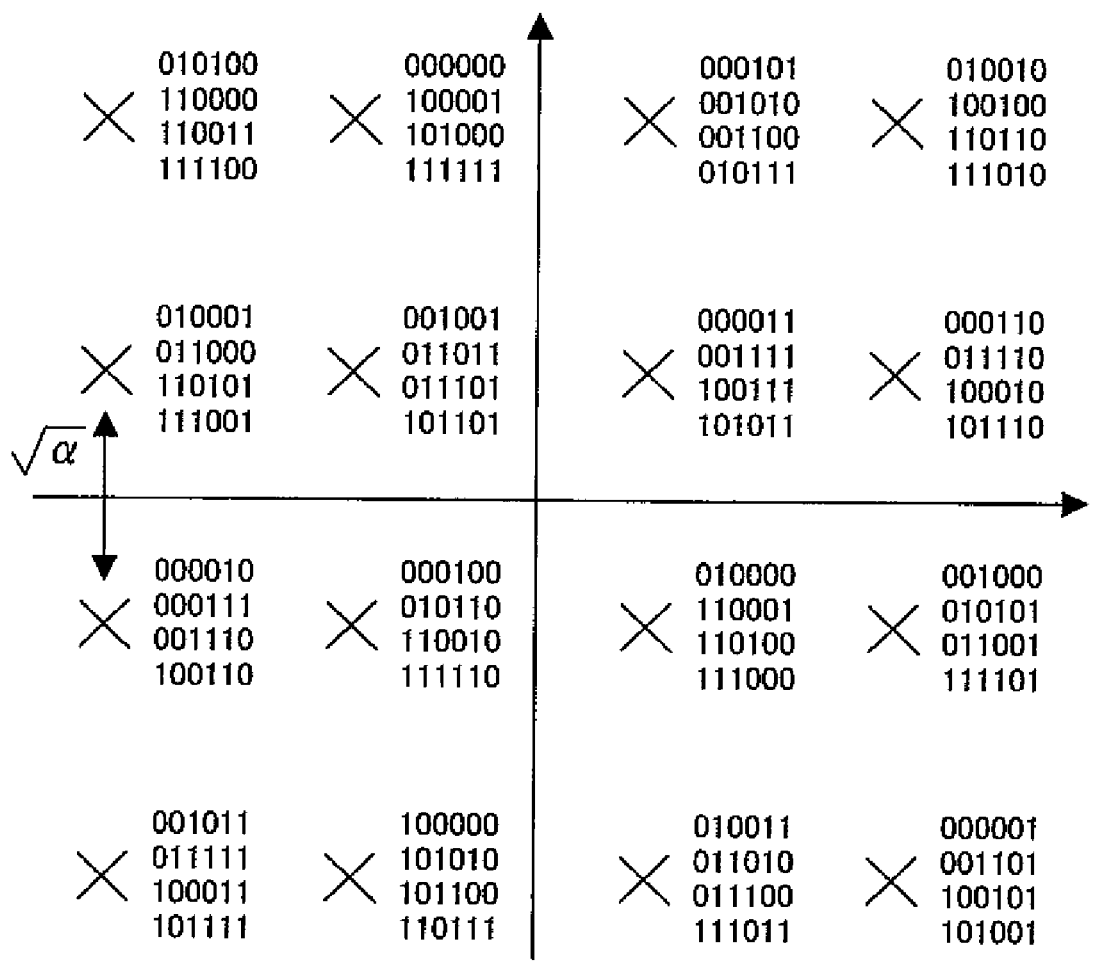
FIG. 32 is a diagram showing an extended mapping technique described in IEEE PIMRC, 2006.
Figure 33:
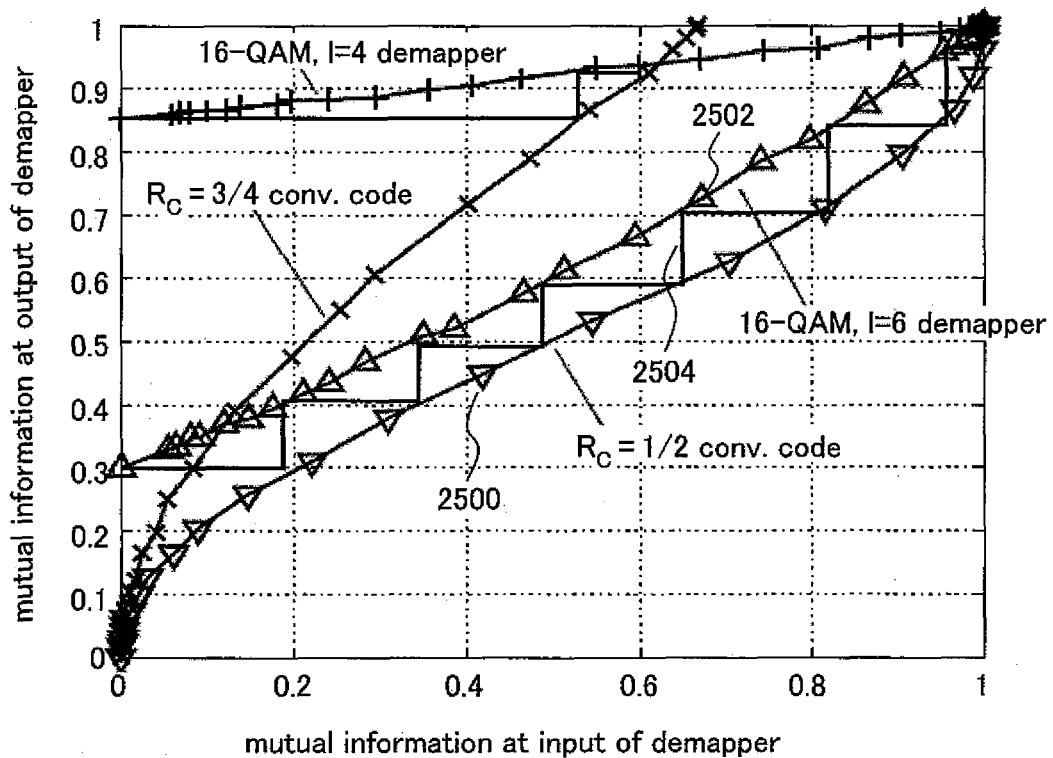
FIG. 33 is a diagram showing an EXIT chart concerning a BICM-ID technique described in IEEE PIMRC, 2006.

In the EXIT charts (FIG. 31 and FIG. 33) shown in IEEE GLOBECOM 2003, pp. 3316-3320, 2003 and IEEE PIMRC, 2006, the EXIT curve concerning the demapper has a linearly upward sloping characteristic, and the EXIT curve concerning the decoder has an upward sloping reversed S-shaped characteristic. Therefore, a rate loss arises. In contrast, a rate loss caused by the present invention is quite limited. When a signal-to-noise is low, a small loss arises as shown in FIG. 22. This is attributable to the adoption of 256 QAM (I=16) that permits representation of a large number of values. When any other modulation technique shown in any of FIG. 3A or FIG. 3B is selected, the rate loss is nullified in the same manner as that shown in FIG. 23 to FIG. 26.

FIG. 28 shows a transfer rate to be attained by the foregoing constitution. A solid line 2800 indicates a channel capacity known as the Shannon limit, a dashed line 2802 indicates 90% of the channel capacity, and filled circles indicate transfer rates offered by the code constructions I to V associated with the curves shown in FIG. 22 to FIG. 26. Within a domain of signal-to-noise ratios ranging from 0 dB to 20 dB, 90% of the channel capacity is attained. According to the present invention, the transfer rate very close to a theoretical limit can be attained.

In the first to fourth embodiments, the encoders are different from one another. All or a majority of bits to be fed to the modulator (mapper) 12 are duplicates of information bits. The techniques employed in the embodiments basically have a specialty of an iterative code. This is a factor causing the EXIT curve concerning the decoder to slope upwards as it goes rightward and have a downward convex part. As long as all or a majority of bits to be fed to the modulator (mapper) is duplicates of information bits, the EXIT curve concerning the decoder matches the EXIT curve concerning the demodulator (demapper) to be paired with the modulator (mapper) having any of the configurations shown in FIG. 3A to FIG. 3C, any encoding technique other than those presented in the aforesaid embodiments can be adopted as an alternative encoding technique.

Generally, the EXIT curve concerning the demodulator (demapper) 13 takes on different shapes between a case where all signal points of a transmission symbol are used on the average and a case where specific signal points alone are used exclusively. Therefore, in a special case where all information bits are 0s or 1s, receiving-side processing may not converge. For example, in the first embodiment, when all information bits are 0s, bits to be fed to the modulator 12 are all 0s. Therefore, in the 16 QAM (I=8) modulator shown in FIG. 3A, all symbols to be sent represent only on signal point (0, 0, 0, 0). Likewise, when all information bits are 1s, bits to be fed to the modulator 12 are all 1s. Therefore, in the 16 QAM (I=8) modulator shown in FIG. 3A, bits to be fed to the mapper 31-1 are (1, 0, 0, 1) for all symbols to be sent. An encoding method cannot normally be varied depending on information to be sent. Therefore, the encoding method has to be adjusted so that the EXIT curves concerning the demodulator and decoder will not intersect with respect to all combinations of information bits to be sent. In this case, the EXIT curves become closest to each other with respect to a specific bit stream, and are therefore separated from each other on the average. A loss in a rate ensues.

Preferably, a means for preventing a bit string, which is fed to the modulator 12, from being set to 1s or 0s should be employed. More particularly, during interleaving, not only bits are reordered but also the polarities (0 and 1) of bits are randomly switched. During paired deinterleaving, the reversed polarities are restored to the original ones. For determining LLRs on the receiving side, the reversal of the polarities of bits is regarded as the reversal of the signs (±). When the reversal of the polarities of bits is performed by the encoder, the even-numbered bits may be held intact and the odd-numbered bits may be reversed. As a result, for example, an output bit string of b0, b0, b0, b1, b1, b1, b2, b2, etc. shown in FIG. 20D becomes a bit string of b0, ~b0, b0, ~b1, b1, ~b1, b2, ~b2, etc. For any information bits, a specific bit string such as a bit string of all 0s or 1s will not be generated.

Herein, the symbol ~ means the reversal of a bit. Even when polarity reversal is performed regularly, since bits are reordered at random during interleaving, a bit string to be fed to the modulator 12 includes randomly reordered bits. Such an incident will not take place that specific signal points are exclusively used as signal points to be represented by a modulated symbol to be sent.

Generally, about a half of bits constituting a bit string to be fed to the modulator 12 should have the polarities thereof reversed at random. However, it is undesirable that an information bit string to be fed to the encoder 10 is reversed at random. This is because if a bit string corresponding to a reversal pattern is a string of information bits, the string is changed to a bit string of all 0s or all 1s. In the present invention, reversing processing is performed on a bit string having undergone iterative encoding. Therefore, any information bit string will not be modulated into a bit string of all 0s or 1s. As a result, an EXIT curve concerning the demodulator (demapper) 13 will not be varied depending on an information bit string.

When a BICM-ID technique is constructed using the systematic LDPC code described in IEEE Transactions on Communications, Vol. 52, No. 4, April 2004, systematic bits are mapped into a symbol as they are. In particular, when an encoding ratio is high and the number of parity bits is small, the systematic bits are modulated into many transmission symbols. When QAM or any other multi-valued modulation technique is adopted, a problem that specific signal points in the transmission symbol are used exclusively to treat a specific information bit string cannot be prevented. In relation to a wireless technique known as a 3rd-generation partnership project (SGPP) long-term evolution (LTE) technique, a technology is known to perform scrambling processing on data using a pseudo-noise string after interleaving processing. However, when the encoding ratio is high, many bits included in a bit string are systematic bits, and specific signal points may be used exclusively. According to the present invention, since iterative encoding is basically adopted as encoding, the encoding ratio set in the encoder 10 is low. A bit string constituting a code word can be prevented from being set to a specific bit pattern through the aforesaid simple processing. Therefore, for construction of a BICM-ID technique employing QAM or any other multi-valued modulation, the present invention is thought to be advantageous.

In the aforesaid embodiments, a description has been made mainly of demodulating (demapping) processing and decoding processing. Needless to say, pieces of processing required for normal wireless communications, such as, processing of a radiofrequency circuit, timing synchronization, and wave detecting processing for correcting phase rotation occurring through a propagation channel have to be performed separately. The aforesaid embodiments relate to wireless communication apparatus, and may also be applied to other type of communication apparatus that performs encoding and modulation, for example, a wired modem.

While a transfer rate very close to the theoretical limit is attained, a code based on a very simple iterative code is adopted for encoding. Since a decoding processing quantity is limited, the present invention can be widely applied to various types of pieces of communication apparatus including wireless communication apparatus.

What is claimed is:

1. A transmitter comprising:
   an encoder that performs iterative encoding on a first bit string;
   an interleaver that interleaves a code word outputted from the encoder; and
   a modulator that modulates and converts a second bit string outputted from the interleaver into a symbol, wherein
   the encoder outputs duplicated codewords of the first bit string;
   the modulator maps a third bit string, which is produced by thinning the number of bits constituting the second bit string, into the symbol; and
   the third bit string includes at least one first bit, which is produced from one bit included in the second bit string, and a group of second bits produced by computing a plurality of bits included in the second bit string.

2. The transmitter according to claim 1, wherein a bit included in the second bit string and used to produce a certain bit included in the third bit string is not used to produce the other bits included in the third bit string.

3. The transmitter according to claim 1, wherein a non-gray mapping technique is used to map the third bit string into the symbol.

4. The transmitter according to claim 1, wherein:
   the encoder includes a plurality of bit duplicators for which mutually different numbers of times of iteration are designated; and
   the encoder uses the plurality of bit duplicators at a predetermined ratio so as to iteratively encode the first bit string.

5. The transmitter according to claim 1, wherein the first bit string includes information bits and a parity bit.

6. The transmitter according to claim 1, wherein the interleaver randomly reorders bits constituting the code word and switches the polarities of the bits.

7. A communication system comprising:
   a transmitter which includes an encoder that performs iterative encoding on a first bit string, an interleaver that interleaves a code word outputted from the encoder, and a modulator which maps a third bit string, which is produced by thinning a number of bits constituting the second bit string, into a symbol, the third bit string including at least one first bit, which is produced from one bit included in the second bit string, and a group of second bits being produced by computing a plurality of bits included in the second bit string; and
   a receiver which receives a train of symbols into each of which a predetermined number of k bits are converted, and each of which is produced by thinning duplicate bits, which are produced by iteratively encoding the predetermined number of bits by dv times of iteration, into m bits (m<I) in units of I bits, and allocating the m bits to one symbol, and which includes a symbol demapper that outputs first external information using a received symbol and pieces of a priori information on (I−1) bits used to calculate the first external information on m bits, a check-node decoder uses the first external information and outputs second external information on one bit using pieces of first external information on m bits, which constitute the received symbol, outputted from the symbol demapper, and the pieces of a priori information on (I−1) bits, a deinterleaver that deinterleaves pieces of second external information on a plurality of bits included in the symbol, a variable-node decoder that outputs third external information on one bit using the pieces of second external information on (dv−1) bits, which are outputted from the deinterleaver, as pieces of a prior information, and an interleaver that performs interleaving, which is a reverse of processing performed by the deinterleaver, on the pieces of third external information on duplicate bits which are outputted from the variable-node decoder, wherein the check-node decoder outputs pieces of fourth external information on the m bits using the pieces of third external information on the I bits, which are outputted from the interleaver, as pieces of a priori information, and the pieces of fourth external information are used as pieces of a prior information by the symbol demapper.

8. The communication system according to claim 7, wherein:

the check-node decoder has a capability to convert the m bits into the I bits;

at least one of the m bits is determined with one bit of the I bits, and the other bits out of the m bits are converted by computing a predetermined number of bits out of the I bits.

9. The communication system according to claim 8, wherein:

a bit out of the I bits to be converted into a certain bit out of the m bits is not converted into the other bits of the m bits.

* * * * *